(12) United States Patent
Toyokawa et al.

(10) Patent No.: US 6,576,509 B1
(45) Date of Patent: Jun. 10, 2003

(54) SEMICONDUCTOR INTEGRATED CIRCUIT DEVICE AND METHOD OF MANUFACTURING THE SAME

(75) Inventors: Shigeya Toyokawa, Kodaira (JP); Takashi Hashimoto, Iruma (JP); Kenichi Kuroda, Tachikawa (JP); Shoji Yoshida, Higashiyamoto (JP); Toshiyuki Iwaki, Tachikawa (JP); Masamichi Matsuoka, Ome (JP)

(73) Assignees: Hitachi Ltd., Tokyo (JP); Hitachi ULSI Engineering Systems Co., Ltd., Tokyo (JP)

( * ) Notice: Subject to any disclaimer, the term of this patent is extended or adjusted under 35 U.S.C. 154(b) by 231 days.

(21) Appl. No.: 09/639,305

(22) Filed: Aug. 16, 2000

(30) Foreign Application Priority Data

Aug. 18, 1999 (JP) .......................................... 11-231031

(51) Int. Cl.$^7$ ......................................... H01L 21/8242
(52) U.S. Cl. ...................... 438/253; 438/296; 438/299; 438/300; 438/306
(58) Field of Search ........................ 438/253; 257/296, 257/306, 299, 300

(56) References Cited

U.S. PATENT DOCUMENTS 5,604,365 A * 2/1997 Kajigaya et al. ............ 257/296
6,329,681 B1 * 12/2001 Nakamura et al. .......... 257/297

FOREIGN PATENT DOCUMENTS

| JP | 945770 | 2/1997 |
| JP | 10270548 | 10/1998 |

* cited by examiner

Primary Examiner—David Nelms
Assistant Examiner—Reneé R Berry
(74) Attorney, Agent, or Firm—Antonelli, Terry, Stout & Kraus, LLP

(57) ABSTRACT

In forming a plug 21 of a polycrystalline silicon film in a contact hole 19 to which a bit line BL is connected, the upper surface of the plug 21 is retracted downward from the upper edge of the contact hole 19, and a plug 22 of a laminate of a TiN film 26 and a W film 27 is formed on the plug 21. Then, the W film deposited on the contact hole 19 is patterned to form a bit line BL having a width narrower than the diameter of the contact hole 19. Here, the W film 27 constituting part of the plug 22 in the contact hole 19 is etched, but the TiN film 26 constituting another part of the plug 22 is not almost etched.

10 Claims, 37 Drawing Sheets

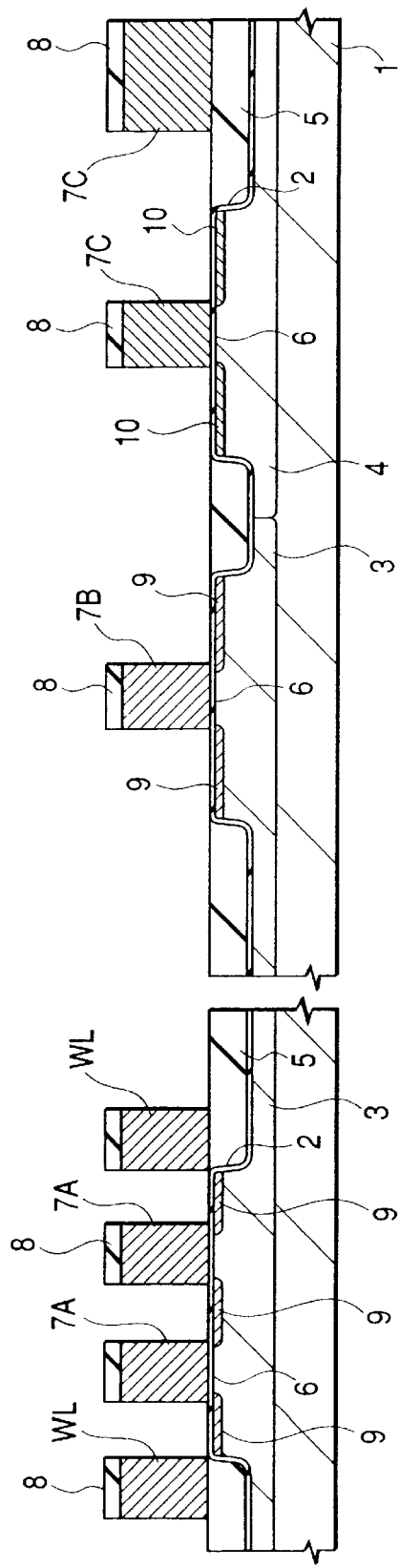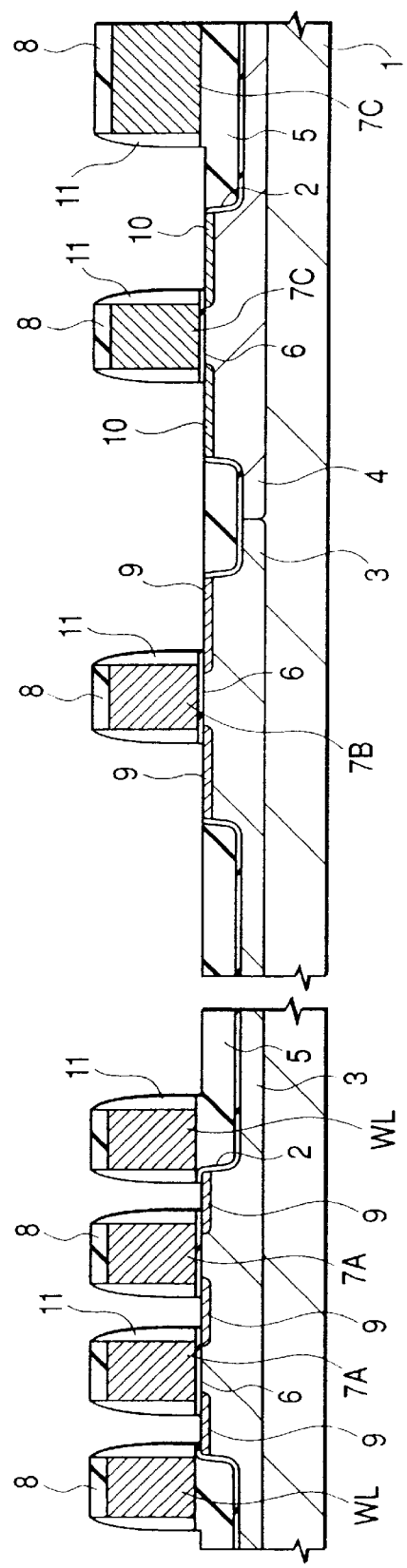

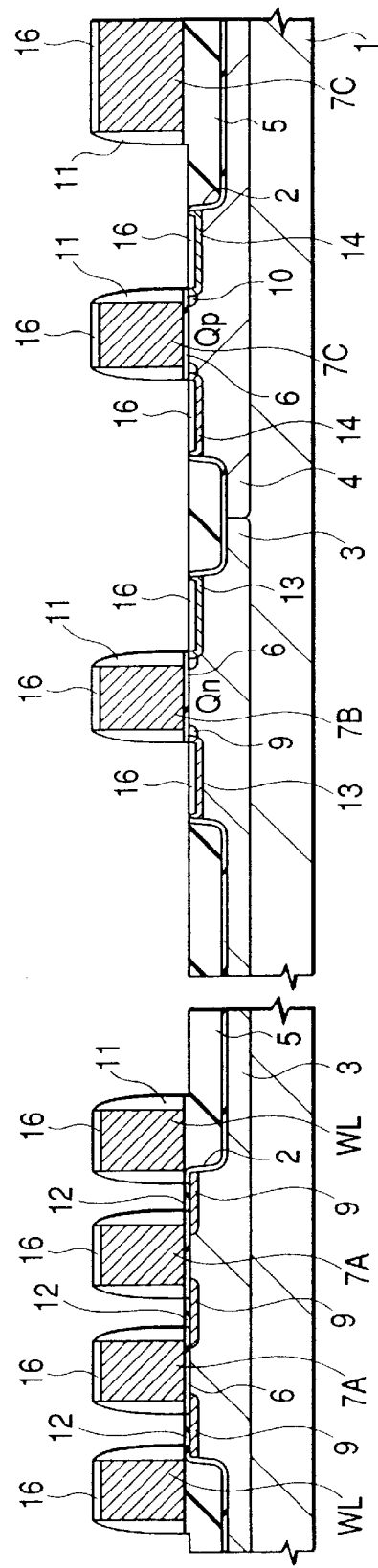
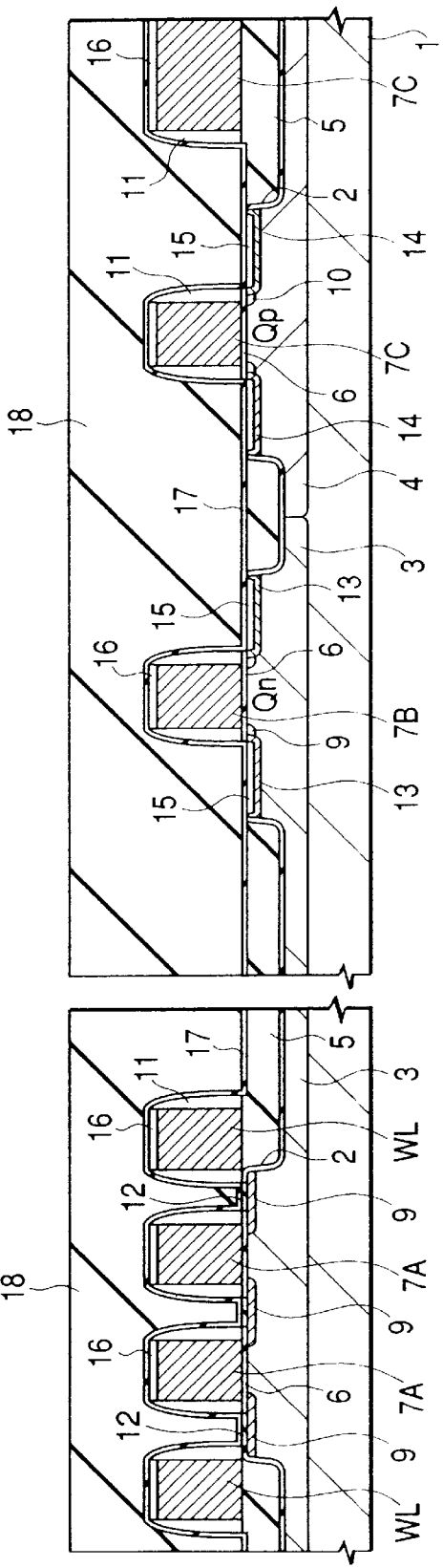

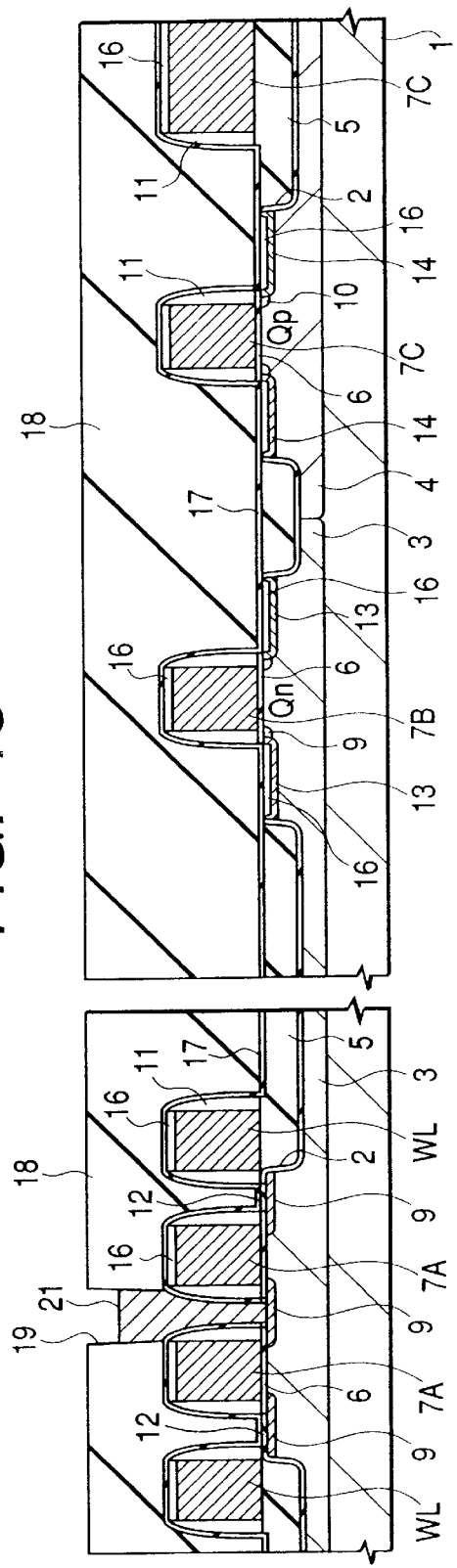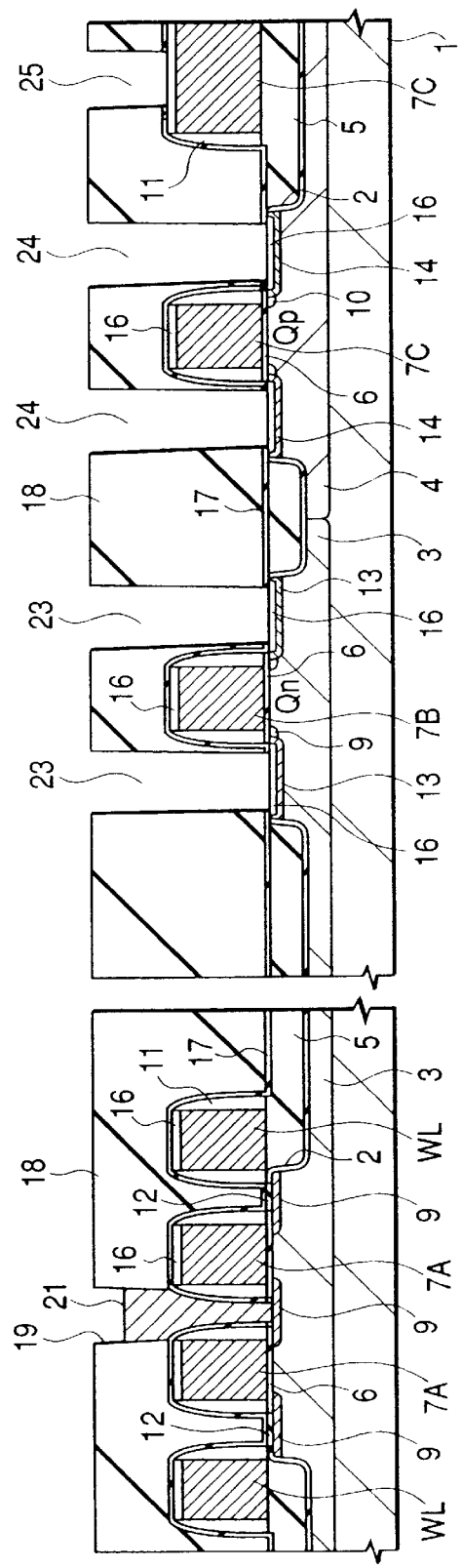

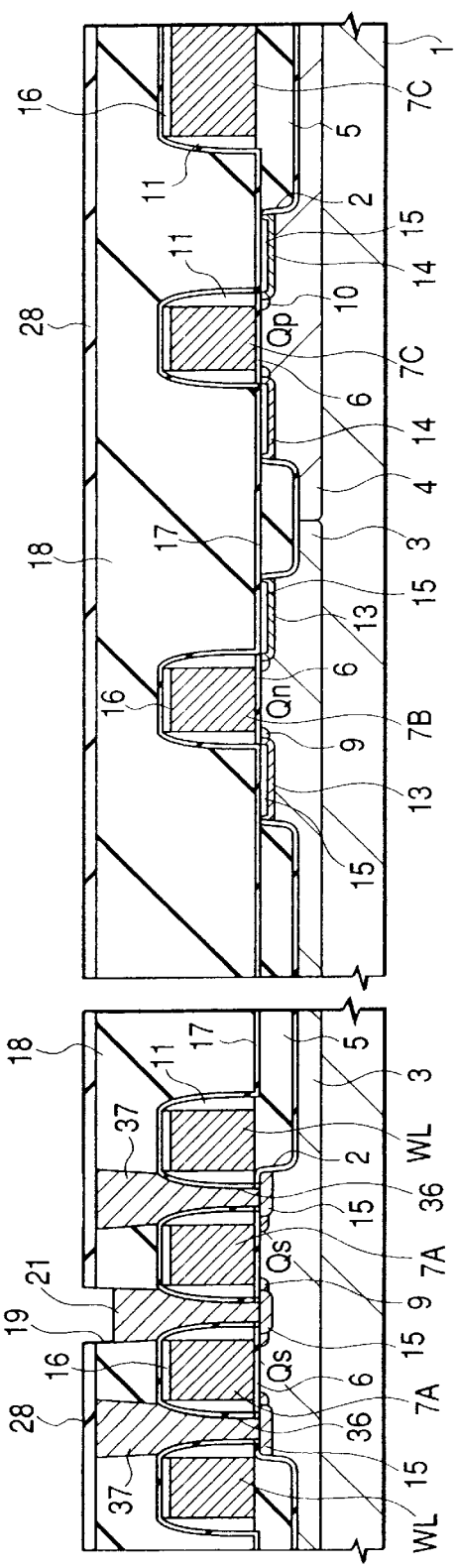
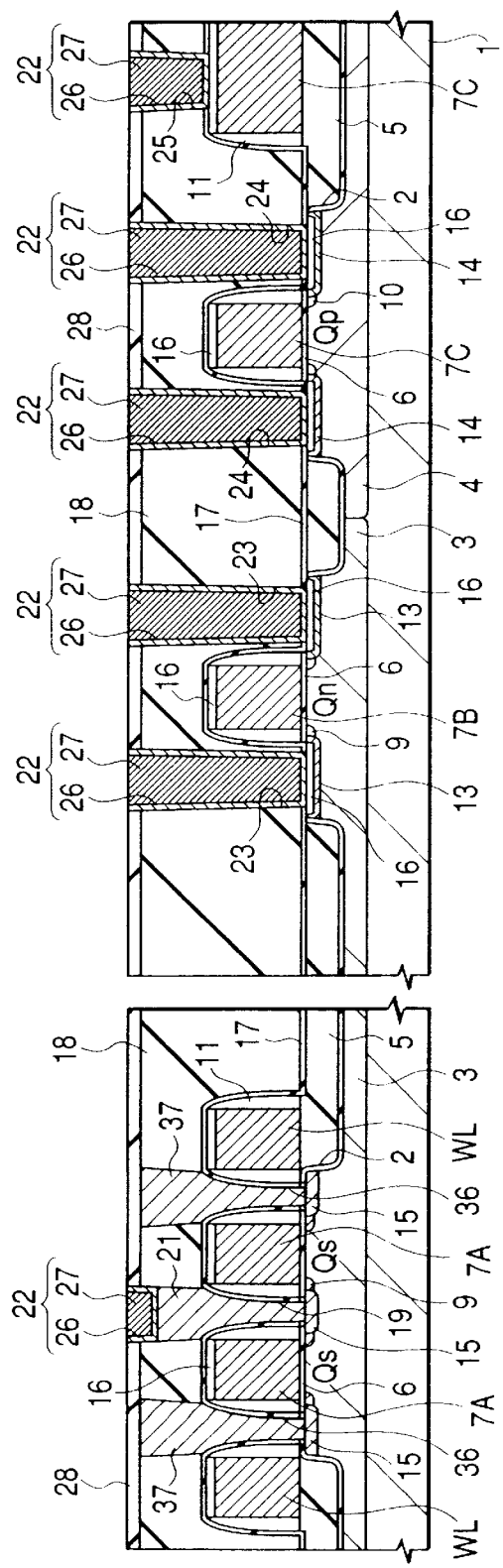

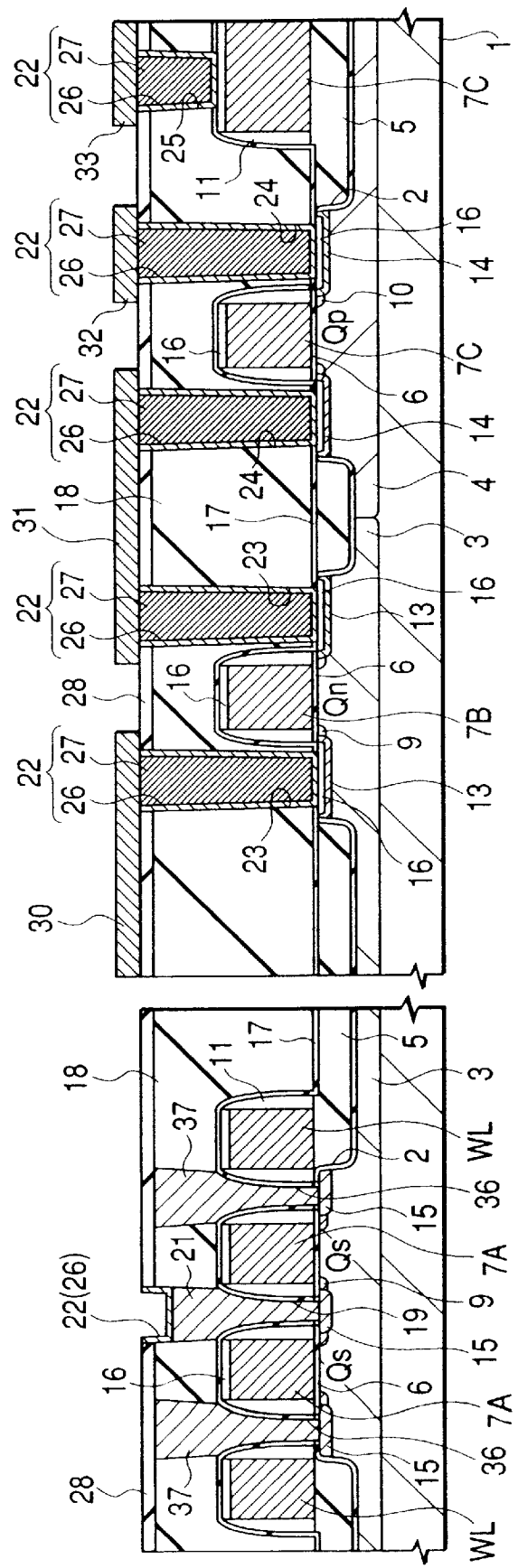

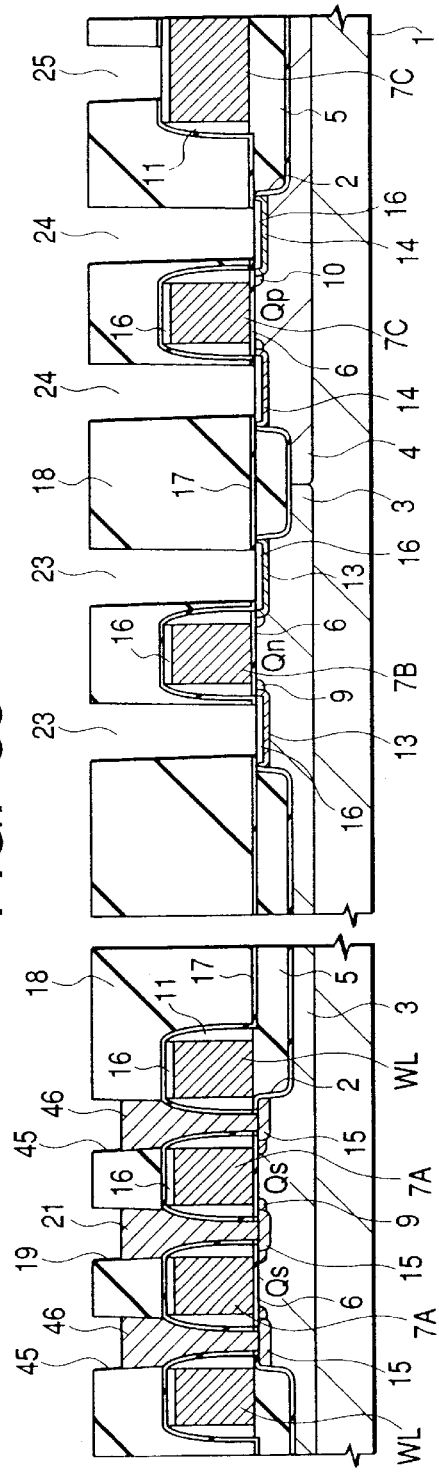
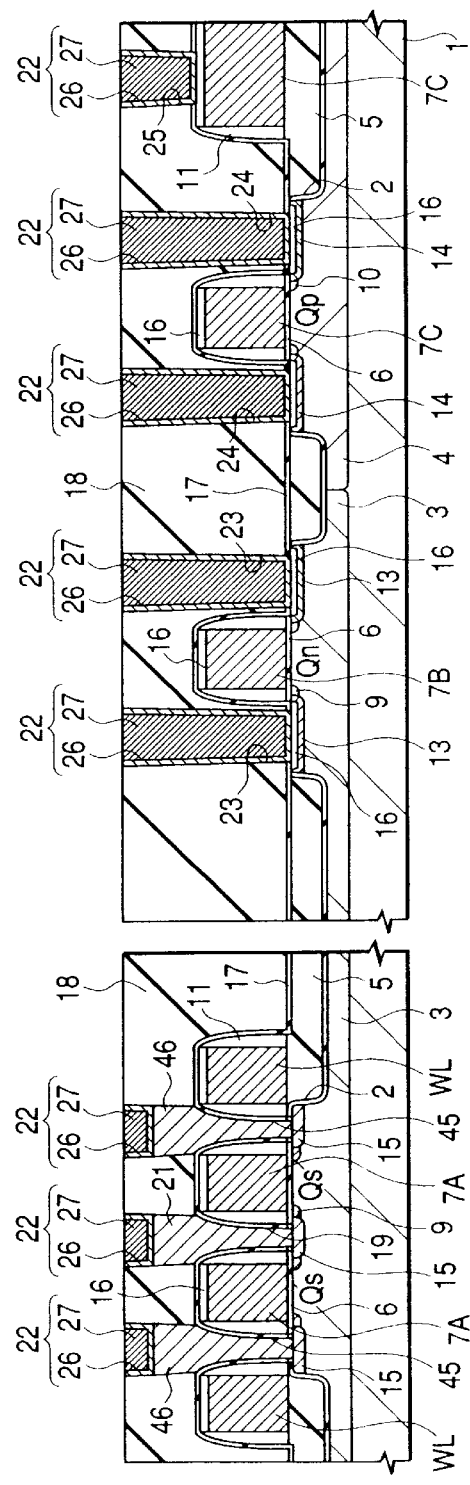
FIG. 38
FIG. 39

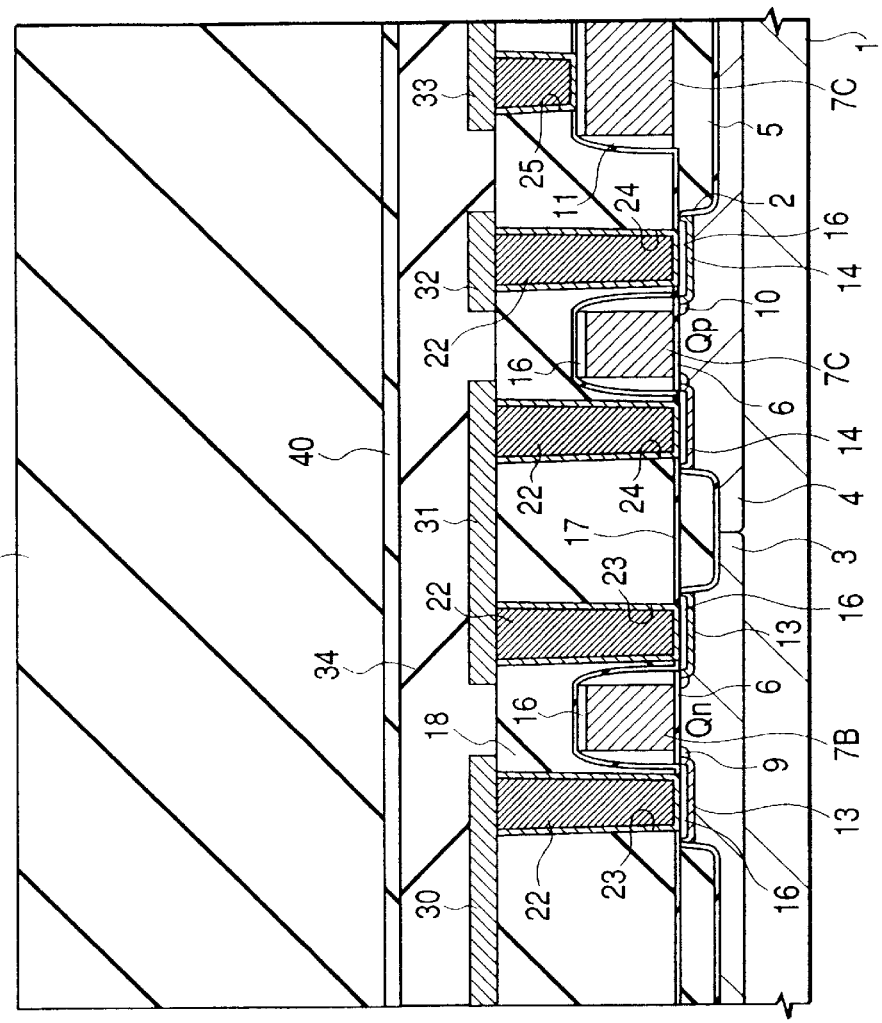
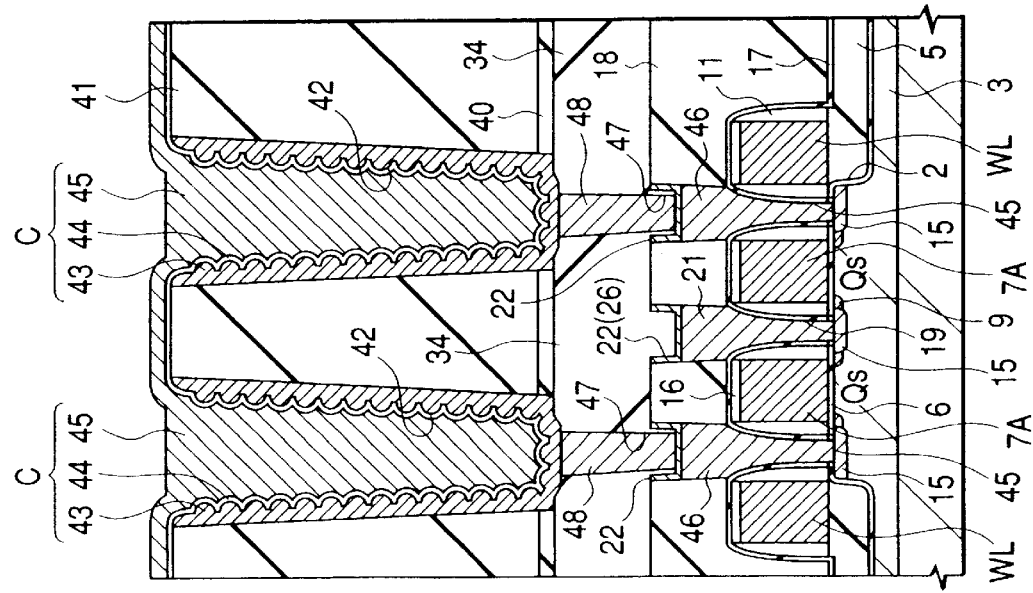
FIG. 43

SEMICONDUCTOR INTEGRATED CIRCUIT DEVICE AND METHOD OF MANUFACTURING THE SAME

BACKGROUND OF THE INVENTION

1. Field of the Invention

The present invention relates to a semiconductor integrated circuit device and method of manufacturing the same. In particular, the invention relates to technology that can be effectively applied to a semiconductor integrated circuit device having a DRAM (dynamic random access memory).

2. Prior Art

Memory cells in a DRAM are arranged at intersecting points of plural word lines and plural bit lines arranged in the form of a matrix on the main surface of a semiconductor substrate, and are each constituted by a memory cell-selecting MISFET and a data-storing capacitor element (capacitor) connected in series therewith.

The memory cell-selecting MISFET constituting a portion of the memory cell is formed chiefly by a gate oxide film, a gate electrode constituted integrally with a word line, and a pair of semiconductor regions constituting a source and a drain. Further, the data-storing capacitor element constituting another portion of the memory cell is arranged on the memory cell-selecting MISFET, and is electrically connected to either the source or the drain.

A bit line electrically connected to the other one of the source or the drain of the memory cell-selecting MISFET is usually arranged between the memory cell-selecting MISFET and the data-storing capacitor element. This is because, when it is attempted to increase the amount of electric charge stored in the data-storing capacitor element, the surface area must be increased by realizing a three-dimensional structure. When a bit line is arranged on the data-storing capacitor element of the three-dimensional structure, the aspect ratio of the contact hole connecting the bit line to the memory cell-selecting MISFET becomes very great, making it difficult to open a hole.

International Laid-Open Publication WO98/59372 (U.S. Ser. No. 09/446,302) discloses a DRAM in which a bit line is arranged between a memory cell-selecting MISFET and a data-storing capacitor element, and a method of producing the same.

A bit line of the DRAM disclosed in the above publication has a width which is narrower than a gap to a neighboring bit line in order to lower the parasitic capacitance among the bit lines, that becomes conspicuous when a memory cell is realized in a very small size.

Further, the bit line is constituted by a metal film formed chiefly of W (tungsten). By forming the bit line using a metal film of a low resistance, it is allowed to decrease the sheet resistance and, hence, to increase the speed for reading and writing data. It is further allowed to simultaneously form a metal wiring of a peripheral circuit of the DRAM in the step of forming bit lines, making it possible to simplify the step of producing the DRAMs. Besides, tungsten exhibits a larger resistance against the electromigration than aluminum, and makes it possible to decrease breakage in the line when the width of the bit line is very decreased.

The bit line is electrically connected to either the source or the drain of the memory cell-selecting MISFET through a hole formed in the silicon oxide film (second silicon oxide film) and a contact hole formed in the silicon oxide film which is the lower layer (first silicon oxide film). A plug of a polycrystalline silicon film having a low resistance is buried in the contact hole formed in the first silicon oxide film.

The bit line is formed roughly through the following process. First, a MISFET (memory cell-selecting MISFET) constituting a memory cell and MISFETs (n-channel MISFET and p-channel MISFET) constituting a peripheral circuit are formed on a semiconductor substrate. Then, a first silicon oxide film is formed over these MISFETs, and contact holes are formed in the first silicon oxide film over the source and drain of the memory cell-selecting MISFET. One of these contact holes is used for connecting either one of the source or the drain to the bit line, and the other one is used for connecting the other one of the source or the drain to the data-storing capacitor element.

Next, a polycrystalline silicon film doped with n-type impurities (e.g., P (phosphorus)) is deposited on the first silicon oxide film and, then, unnecessary polycrystalline silicon film on the silicon oxide film is removed to form a plug in the contact hole.

Next, a second silicon oxide film is formed on the first silicon oxide film, and a through hole is formed in the second silicon oxide film on one of the contact holes (contact hole to which the bit line is connected). The second silicon oxide film is formed for maintaining electric insulation between the bit line and the plug in the other contact hole (contact hole to which the data-storing capacitor element is connected).

Next, the tungsten film is formed on the second silicon oxide film that includes a region over the through hole, and is then patterned to form a bit line. Here, however, when the bit line formed of tungsten film comes into direct contact with the plug (polycrystalline silicon film) in the contact hole, a silicide layer having a high electric resistance is formed on the interface between the two. Therefore, a barrier film such as TiN (titanium nitride) is formed between the bit line (W film) and the plug (polycrystalline silicon film) to prevent the interfacial reaction between them. That is, in a practical step of forming bit lines, a TiN film is, first, formed on the second silicon oxide film inclusive of an upper region of the through hole and, then, the tungsten film is formed on the TiN film. Thereafter, the tungsten film and the TiN film are patterned by dry-etching by using a photoresist film as a mask to form bit lines.

SUMMARY OF THE INVENTION

The TiN film has an electric resistance larger than that of the W film. It is therefore desired that the TiN film has a small thickness from the standpoint of decreasing parasitic resistance. Besides, the contact resistance between the TiN film and the polycrystalline silicon film is greater than that of between the TiN film and the W film. From the standpoint of decreasing the parasitic resistance, therefore, it is better that the contact area is great between the TiN film and the polycrystalline silicon film.

Further, the TiN film has a large stress. Therefore, if the thickness of the film is increased, voids develop between the TiN film and the polycrystalline silicon film due to stress possessed by the TiN film, and the interface between the TiN film and the polycrystalline silicon film is completely peeled off. From the standpoint of decreasing the stress in the TiN film, it is desired that the thickness of the TiN film is small. Further, even if voids have developed to some extent, the structure must be such that a reliable connection is maintained between the TiN film and the polycrystalline silicon film.

However, the source of memory cell-selecting MISFET and the diameter of the contact hole formed on the drain are becoming ever small accompanying an increase in the degree of integration, and the aspect ratio of the contact hole is becoming ever large.

In the above-mentioned DRAM of the prior art, further, the width of the bit line is becoming narrower than the diameters of the contact hole and the through hole through which the bit line is connected to the memory cell-selecting MISFET as a result of considerably decreasing the width of the bit line for decreasing the size of the memory cell.

When the width of the bit line constituted by a laminate of the TiN film and the W film is considerably decreased, the contact area between the plug buried in the contact hole and the bit line formed thereon decreases in proportion thereto. Here, the polycrystalline silicon film constituting the plug has its interface contacted to the TiN film that constitutes the lower layer of the bit line. As the contact area between the bit line and the plug decreases, however, the contact resistance greatly increases between the bit line and the plug. Further, voids occur in the interface between them due to contraction of volume of the TiN film caused by the heat treatment executed in the step of production, whereby the contact resistance further increases between the two and, in an extreme case, a defect occurs in that the bit line peels off the surface of the plug.

Further, according to the prior art of forming bit lines by dry-etching the laminate of the TiN film and the W film, it becomes difficult to maintain the etching selection ratio for the polycrystalline silicon film and the TiN film constituting the plug, and the surface of the plug (polycrystalline silicon film) is deeply etched during the patterning of the bit lines.

In the above-mentioned DRAM of the prior art, further, the contact hole is formed in the first silicon oxide film to bury the plug therein and, then, the second silicon oxide film is formed on the first silicon oxide film, and the through hole is formed in the second silicon oxide film on one of the contact holes (contact hole to which the bit line is connected), causing the steps to become complex. Such an increase in the number of steps becomes a problem particularly in the DRAM in which the metal wiring of the peripheral circuit is simultaneously formed in the step of forming the bit lines, and in the DRAM-logic hybrid LSI in which the metal wiring of the logic circuit is simultaneously formed in the step of forming the bit lines.

It is an object of the present invention to provide technology related to a DRAM forming bit lines on the plugs constituted by a polycrystalline silicon film via a barrier layer, decreasing the contact resistance and improving reliability in the connection by preventing a reduction in the contact area between the plug and the barrier layer.

Another object of the present invention is to provide technology capable of decreasing the number of the steps for producing a DRAM forming bit lines on the plugs constituted by a polycrystalline silicon film via a barrier layer, or a hybrid LSI including the DRAM.

The above and other objects as well as novel features of the present invention will become obvious from the description of the specification and the accompanying drawings.

Briefly described below are representative examples of the inventions disclosed in this application.

(1) A semiconductor integrated circuit device according to the invention comprises:

a first insulating film formed on a first MISFET in a first region and on a second MISFET in a second region on the main surface of a semiconductor substrate;

a first plug electrically connected to either the source or the drain of the first MISFET and a second plug formed on the first plug, the first and second plugs being buried in a first connection hole formed in the first insulating film in the first region;

a third plug electrically connected to either the source or the drain of the second MISFET, the third plug being buried in the second connection hole formed in the first insulating film in the second region; and a first wiring formed on the first insulating film in the first region, the first wiring being electrically connected to either the source or the drain of the first MISFET via the first plug and the second plug in the first connection hole; wherein the second plug in the first connection hole is constituted by a first metal film of a first metal material and a second metal film of a second metal material formed thereon; and the third plug in the second connection hole is constituted by a third metal film of the first metal material and a fourth metal film of the second metal material formed thereon.

(2) A method of manufacturing a semiconductor integrated circuit device of the invention comprises the steps of:

(a) forming a first MISFET in a first region on the main surface of a semiconductor substrate, forming a second MISFET in a second region, and forming a first insulating film on the first MISFET and on the second MISFET on the main surface of the semiconductor substrate;

(b) forming a first connection hole in the first insulating film in the first region, and burying a first plug in the first connection hole to electrically connect the first plug to either one of the source or the drain of the first MISFET;

(c) forming a second connection hole in the first insulating film in the second region, burying a second plug on the first plug in the first connection hole in a manner that the first plug and the second plug are electrically connected together, and burying a third plug in the second connection hole so as to be electrically connected to either the source or the drain of the second MISFET; and (d) forming a first wiring on the first insulating film in the first region, and electrically connecting either the source or the drain of the first MISFET to the first wiring through the first plug and the second plug in the first connection hole.

BRIEF DESCRIPTION OF THE DRAWINGS

FIG. 4 is a sectional view of a major portion of the substrate illustrating another stage in the method of manufacturing the semiconductor integrated circuit device according to the embodiment 1 of the invention;

FIG. 5 is a sectional view of a major portion of the substrate illustrating a further stage in the method of manufacturing the semiconductor integrated circuit device according to the embodiment 1 of the invention;

FIG. 8 is a sectional view of a major portion of the substrate illustrating another stage in the method of manufacturing the semiconductor integrated circuit device according to the embodiment 1 of the invention;

FIG. 9 is a sectional view of a major portion of the substrate illustrating a further stage in the method of manufacturing the semiconductor integrated circuit device according to the embodiment 1 of the invention;

FIG. 13 is a sectional view of a major portion of the substrate illustrating a further stage in the method of manufacturing the semiconductor integrated circuit device according to the embodiment 1 of the invention;

FIG. 14 is a sectional view of a major portion of the substrate illustrating a still further stage in the method of manufacturing the semiconductor integrated circuit device according to the embodiment 1 of the invention;

FIG. 30 is a sectional view of a major portion of the substrate illustrating a still further stage in the method of manufacturing the semiconductor integrated circuit device according to the embodiment 2 of the invention;

FIG. 31 is a sectional view of a major portion of the substrate illustrating another stage in the method of manufacturing the semiconductor integrated circuit device according to the embodiment 2 of the invention;

FIG. 32 is a sectional view of a major portion of the substrate illustrating a subsequent stage in the method of manufacturing the semiconductor integrated circuit device according to the embodiment 2 of the invention;

FIG. 38 is a sectional view of a major portion of the substrate illustrating a further stage in the method of manufacturing the semiconductor integrated circuit device according to the embodiment 3 of the invention;

FIG. 39 is a sectional view of a major portion of the substrate illustrating a still further stage in the method of manufacturing the semiconductor integrated circuit device according to the embodiment 3 of the invention;

FIG. 43 is a sectional view of a major portion of the substrate illustrating a still further stage in the method of manufacturing the semiconductor integrated circuit device according to the embodiment 3 of the invention;

DESCRIPTION OF THE PREFERRED EMBODIMENTS

Figure 1:
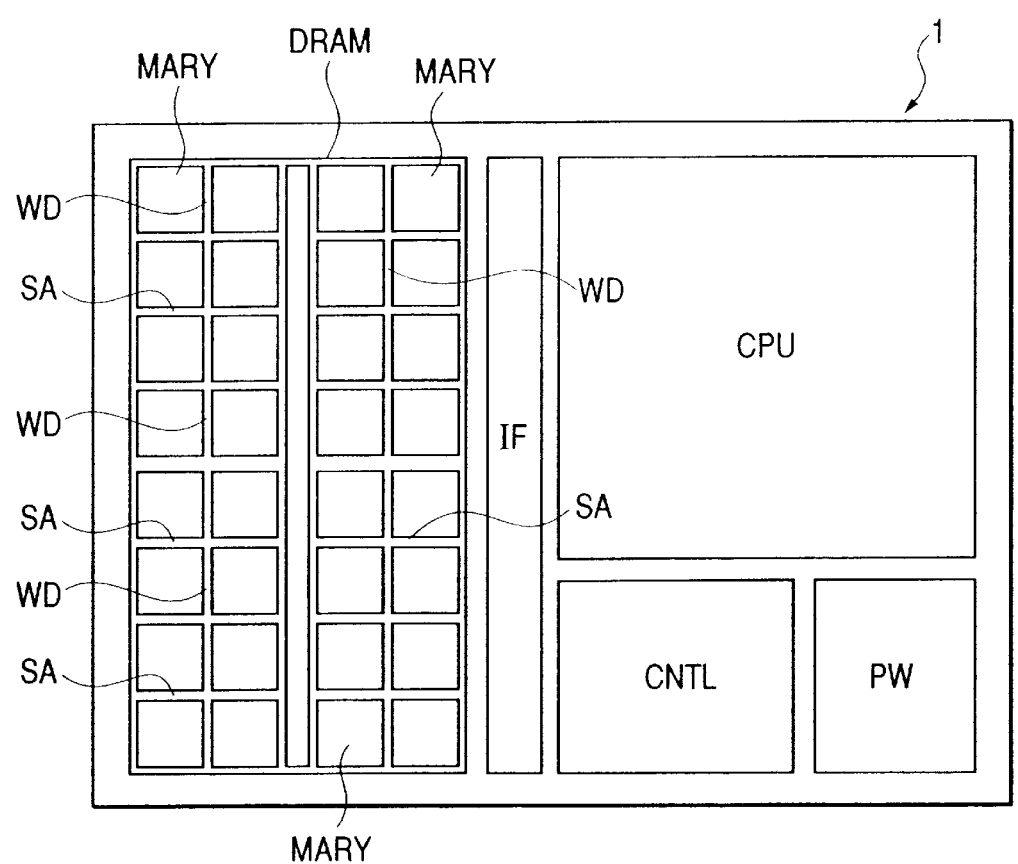
FIG. 1 is a block diagram illustrating an example of the whole constitution of a semiconductor integrated circuit device according to an embodiment 1 of the invention.

Embodiments of the invention will now be described in detail with reference to the drawings. In all of the drawings illustrating the embodiments, the portions exhibiting the same functions are denoted by the same reference numerals but their description is not repeated.

An embodiment 1 of the invention will be described with reference to FIGS. 1 to 27 and FIG. 44.

A semiconductor integrated circuit device of the embodiment is a system LSI mounting a DRAM and a logic LSI, and has a system constitution as shown, for example, in FIG. 1. On the main surface of a semiconductor substrate (hereinafter simply referred to as substrate) 1 are formed a DRAM which is a main memory, a CPU which is an operation unit, a control circuit CNTL for CPU, an interface circuit IF and a power source circuit PW. A region forming the DRAM includes a memory cell array MARY arranging the memory cells in the form of an array, sense amplifiers SA, word line drivers WD, a control circuit for DRAM, and input/output circuits. The sense amplifiers SA and word line drivers WD are formed as peripheral circuits in the peripheries of the memory cell array MARY, and the control circuit and the input/output circuit are formed in the indirect peripheral circuit regions.

Next, a method of producing a system LSI of the embodiment will be described according to the order of steps with reference to FIGS. 2 to 27. Unless otherwise stated, the left side of the substrate shown in cross section in the drawings represents the memory region (memory cell array of DRAM) and the right side represents the logic region.

Figure 2:
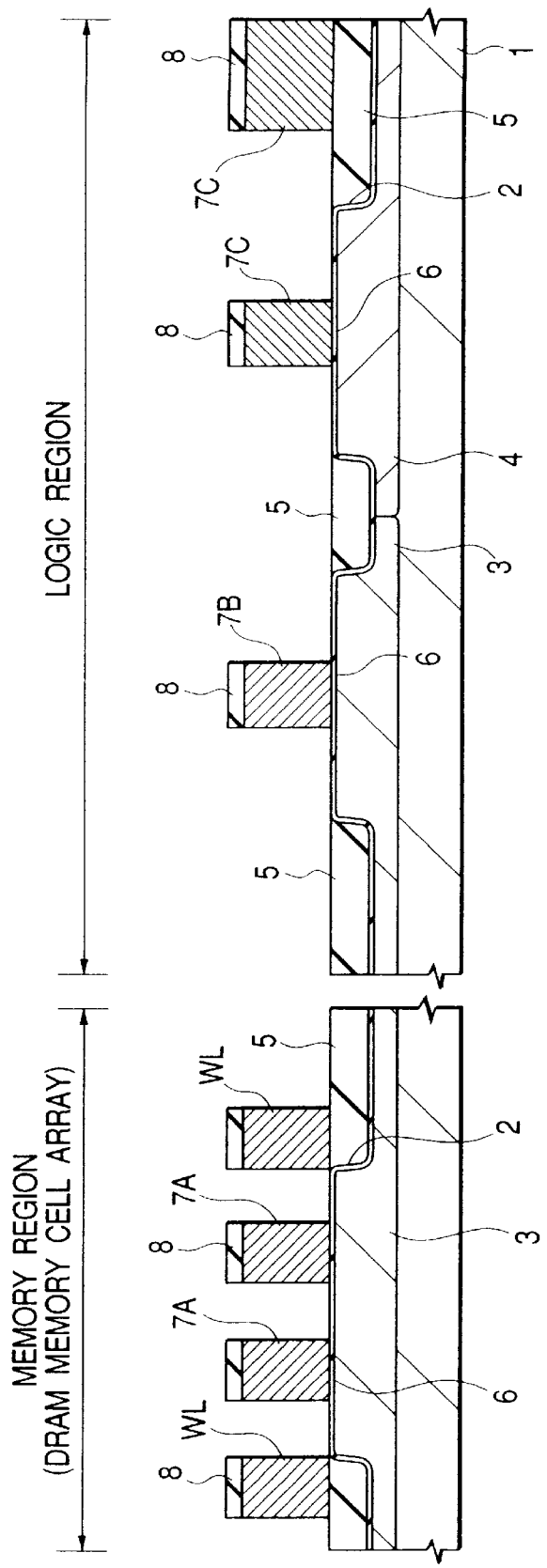
FIG. 2 is a sectional view, taken along line A–A' of FIG. 3, of a major portion of a substrate illustrating an early stage in a method of manufacturing the semiconductor integrated circuit device according to the embodiment 1 of the invention.

Referring, first, to FIG. 2, an element isolation groove 2, a p-type well 3 and an n-type well 4 are formed in the semiconductor substrate (hereinafter simply referred to as substrate) 1 of a p-type single silicon crystal having a resistivity of, for example, about 1 to 10-Ωcm. Then, a gate oxide film 6 having a thickness of about 6 nm to 7 nm is formed on the surfaces of the p-type well 3 and on the n-type well 4 and, then, a gate electrode 7A (word line WL) is formed on the gate oxide film 6 in the memory region, and gate electrodes 7B and 7C are formed on the gate oxide film 6 in the logic region.

The element isolation groove 2 is formed by, first, forming a groove of a depth of about 300 nm to 400 nm by etching the substrate 1 of the element isolation region, depositing a silicon oxide film 5 on the substrate 1 inclusive of the interior of the groove by the CVD (chemical vapor deposition) method, and removing the unnecessary silicon oxide film 5 on the outside of the groove by the chemical mechanical polishing (CMP) method.

The p-type well 3 and the n-type well 4 are formed by implanting p-type impurity (boron) ions into the p-type well-forming region of the substrate 1 and implanting n-type impurity (e.g., phosphorus) ions into the n-type well-forming region, followed by the heat treatment at about 1000° C. to diffuse the impurities. Further, the gate oxide film 6 is formed by washing the surfaces of the p-type well 3 and the n-type well 4 with a washing solution of the type of hydrofluoric acid and, then, the substrate 1 is oxidized with steam at about 800° C.

The gate electrode 7A (word line WL) and the gate electrodes 7B, 7C are formed, for example, by the following method. First, the polycrystalline silicon film (not shown) is deposited maintaining a thickness of about 200 nm on the substrate 1 by the CVD method, n-type impurity (e.g., phosphorus) ions are implanted into the polycrystalline silicon film on the p-type well 3, and p-type impurity (boron) ions are implanted into the polycrystalline silicon film on the n-type well 4. Then, the silicon nitride film 8 is deposited on the polycrystalline silicon film by the CVD method, and the silicon nitride film 8 and the polycrystalline silicon film are dry-etched using the photoresist film (not shown) as a mask. Thus, the gate electrode 7A (word line WL) of n-type polycrystalline silicon is formed on the p-type well 3 in the memory region and, similarly, the gate electrode 7B of n-type polycrystalline silicon is formed on the p-type well 3 in the logic region. Further, the gate electrode 7C of p-type polycrystalline silicon is formed on the n-type well 4 in the logic region.

The gate electrode 7A in the memory region constitutes a gate electrode of memory cell-selecting MISFETQs that will be described later, and the gate electrodes 7B, 7C in the logic region constitute gate electrodes of an n-channel MISFETQn and of a p-channel MISFETQp that will be described later.

Figure 3:
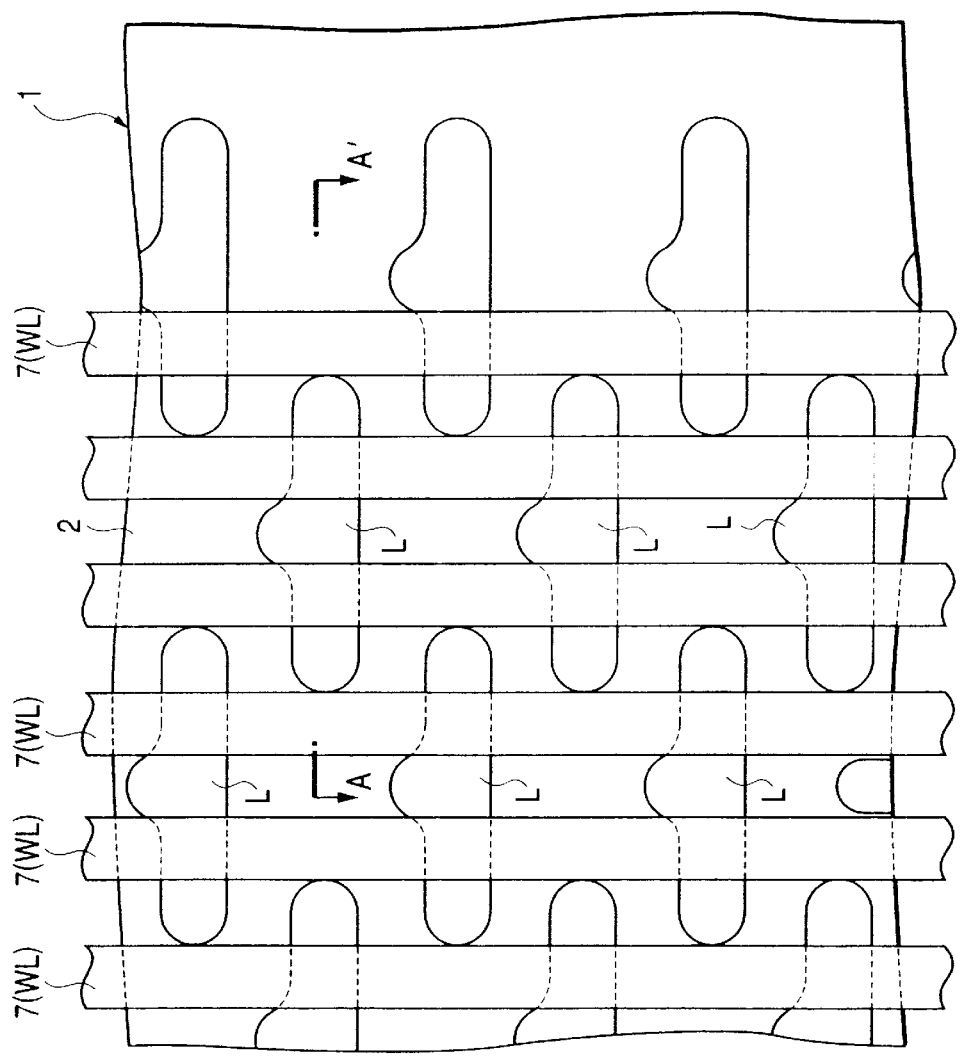
FIG. 3 is a plan view of a major portion of the substrate illustrating a subsequent stage in the method of manufacturing the semiconductor integrated circuit device according to the embodiment 1 of the invention.

FIG. 3 is a plan view illustrating a portion of the memory region on where the gate electrode 7A is formed. FIG. 2 is a sectional view along the line A–A' of FIG. 3.

An active region L surrounded by the element isolation groove 2 has the shape of an island extending in the right-and-left direction in the drawing. As will be described later, each active region L includes two memory cell-selecting MISFETQs sharing either the source or the drain.

The gate electrodes 7A of the memory cell-selecting MISFETQs extend straight in the up-and-down direction in the drawing maintaining the same width and the same space, and work as word lines WL in the regions other than the active region L. The gate electrodes 7A (word lines WL) have a width (gate length) of from 0.13 μm to 0.14 μm, and space between the neighboring gate electrodes 7A (word lines WL) is about 0.13 μm to about 0.14 μm.

Referring next to FIG. 4, n-type impurity (e.g., phosphorus) ions are implanted into the p-type well 3 to form an n--type semiconductor region 9, and p-type impurity (boron) ions are implanted into the n-type well 4 to form a p--type semiconductor region 10. Then, as shown in FIG. 5, the silicon oxide film (not shown) having a thickness of about 50 nm to about 100 nm deposited on the substrate 1 by the CVD method is anisotropically etched to form side wall spacers 11 on the side walls of the gate electrodes 7A (word line WL), 7B and 7C.

Figure 6:
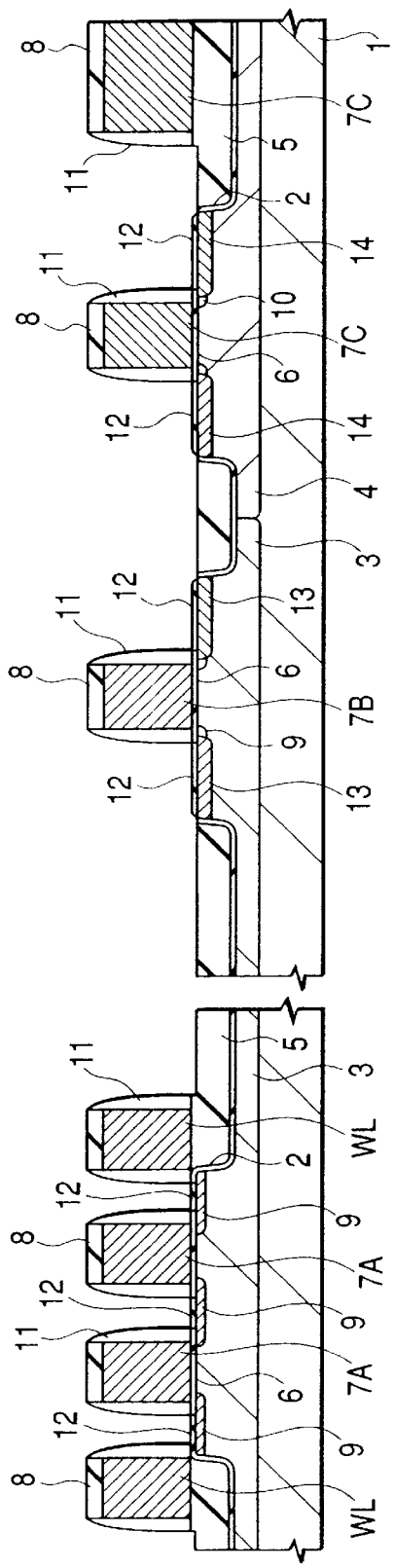
FIG. 6 is a sectional view of a major portion of the substrate illustrating a still further stage in the method of manufacturing the semiconductor integrated circuit device according to the embodiment 1 of the invention.

Referring next to FIG. 6, the substrate 1 is thermally oxidized to form a silicon oxide film 12 on the surface of the n--type semiconductor region 9 and on the surface of the p--type semiconductor region 10. Then, n-type impurity (e.g., phosphorus) ions are implanted into the p-type well 3 in the logic region through the silicon oxide film 12 to form an n+-type semiconductor region 13, and p-type impurity (boron) ions are implanted into the n-type well 4 to form a p+-type semiconductor region 14. The n+-type semiconductor region 13 constitutes the source and drain of the n-channel MISFETQn, and the p+-type semiconductor region 14 constitutes the source and drain of the p-channel MISFETQp.

Figure 7:
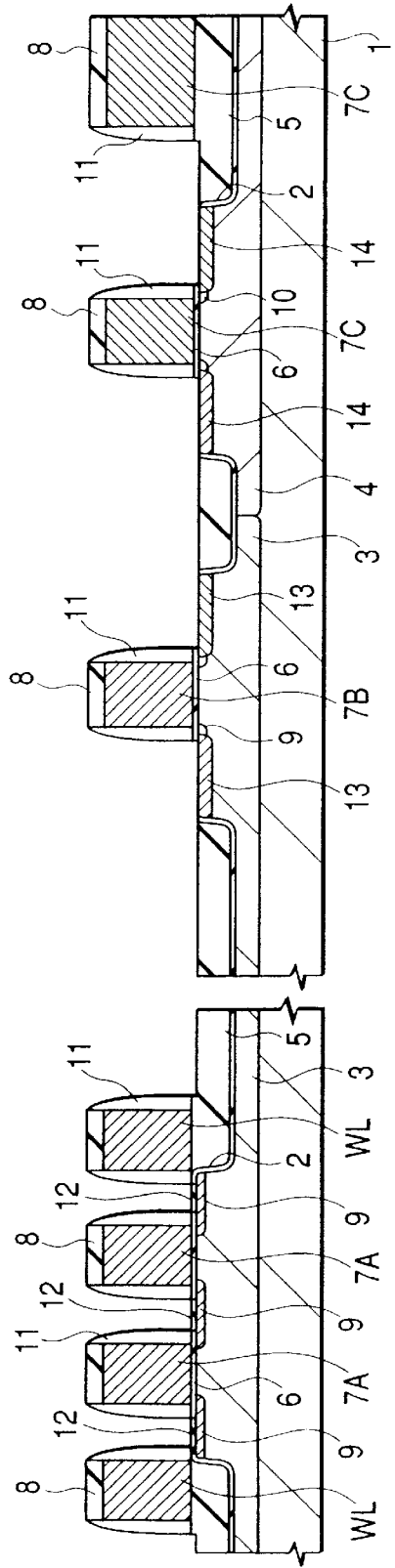
FIG. 7 is a sectional view of a major portion of the substrate illustrating a subsequent stage in the method of manufacturing the semiconductor integrated circuit device according to the embodiment 1 of the invention.

Referring next to FIG. 7, the silicon oxide film 12 is removed by wet etching from the surface of the n+-type semiconductor region 13 and from the surface of the p+-type semiconductor region 14 in the logic region. Here, the memory region is covered with a photoresist film (not shown) so that the silicon oxide film 12 will not be removed from the surface of the n--type semiconductor region 9.

Referring next to FIG. 8, a silicide layer 16 is formed on the surfaces of the gate electrode 7A (word line WL) in the memory region, gate electrodes 7B, 7C in the logic region, n+-type semiconductor region 13 (source, drain) and p+-type semiconductor region 14 (source, drain).

The silicide layer 16 is formed by, first, removing, by etching, the silicon nitride film 8 covering the upper surfaces of the gate electrodes 7A (word line WL), 7B and 7C, depositing a Co (cobalt) film (not shown) on the substrate 1 by sputtering, heat-treating the substrate 1 to react the Co film with silicon (substrate 1 and gate electrodes 7A, 7b, 7C), and removing the unreacted Co film by etching. In this case, the n--type semiconductor region 9 in the memory region is covered with the silicon oxide film 12 and, hence, no silicide layer 16 is formed on the surface thereof. This makes it possible to decrease the leakage current in the memory cell and to improve the refresh characteristics. Through up to this step, further, the n-channel MISFETQn and the p-channel MISFETQp constituting the CMOS circuit in the logic region are nearly completed.

Figure 10:
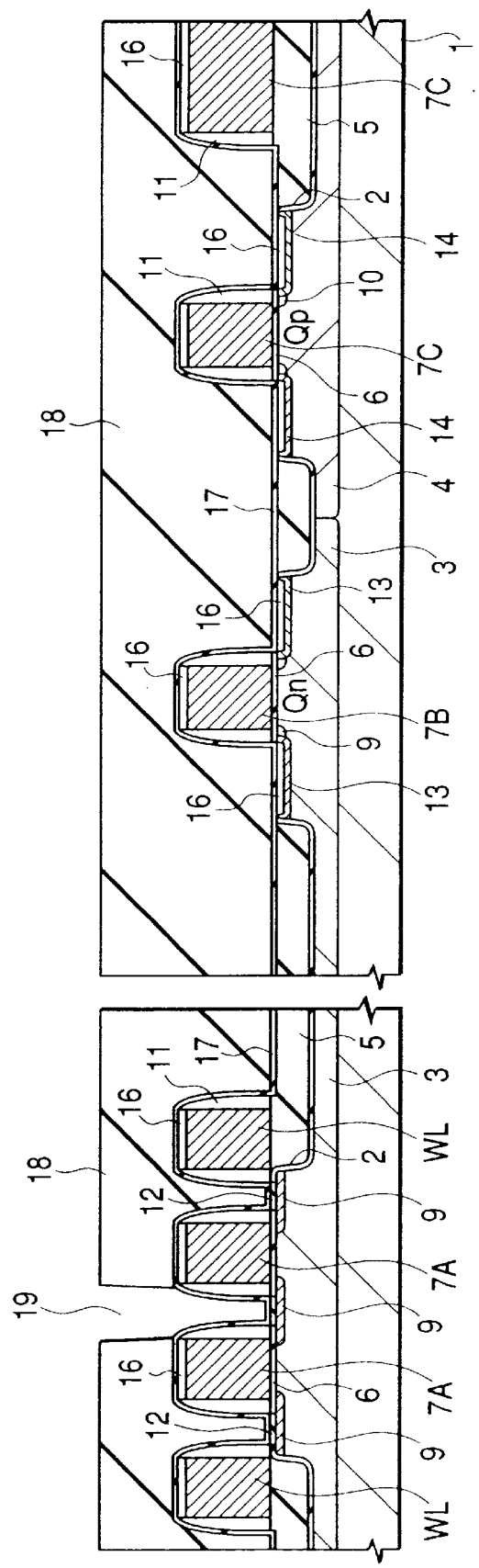
FIG. 10 is a sectional view of a major portion of the substrate illustrating a subsequent stage in the method of manufacturing the semiconductor integrated circuit device according to the embodiment 1 of the invention.

Referring next to FIG. 9, a silicon nitride film 17 having a thickness of about 50 nm to about 100 nm and a silicon oxide film 18 having a thickness of about 400 nm to about 500 nm are deposited on the substrate 1 by the CVD method. Thereafter, the surface of the silicon oxide film 18 is flattened by the chemical mechanical polishing method. Then, as shown in FIG. 10, the silicon oxide film 18, silicon nitride film 17 and silicon oxide film 12 in the memory region are dry-etched to form a contact hole 19 on the n--type semiconductor region 9 to which a bit line will be connected in a subsequent step.

The silicon oxide film 18 is etched under such a condition that the silicon oxide is etched at a larger rate than the silicon nitride, so that the silicon nitride film 17 will not be completely removed. Further, the silicon nitride film 17 is etched under such a condition that the silicon nitride film 17 is anisotropically etched and that the silicon nitride film 17 is left on the side walls of the gate electrode 7A (word line WL). Thus, the contact hole 19 having a very small diameter is formed being self-aligned with the gate electrode 7 (word line WL).

Figure 11:
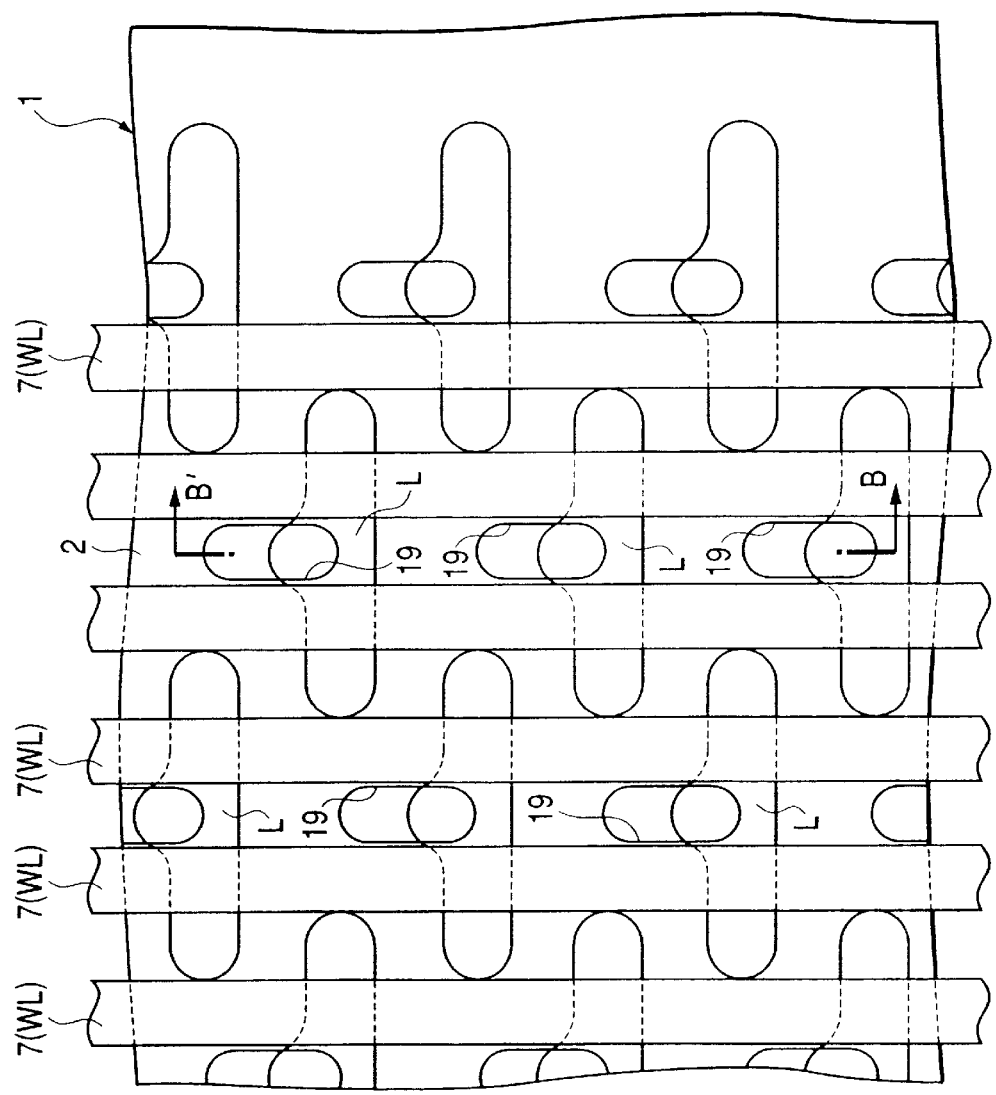
FIG. 11 is a plan view of a major portion of the substrate illustrating a further stage in the method of manufacturing the semiconductor integrated circuit device according to the embodiment 1 of the invention.
Figure 12:
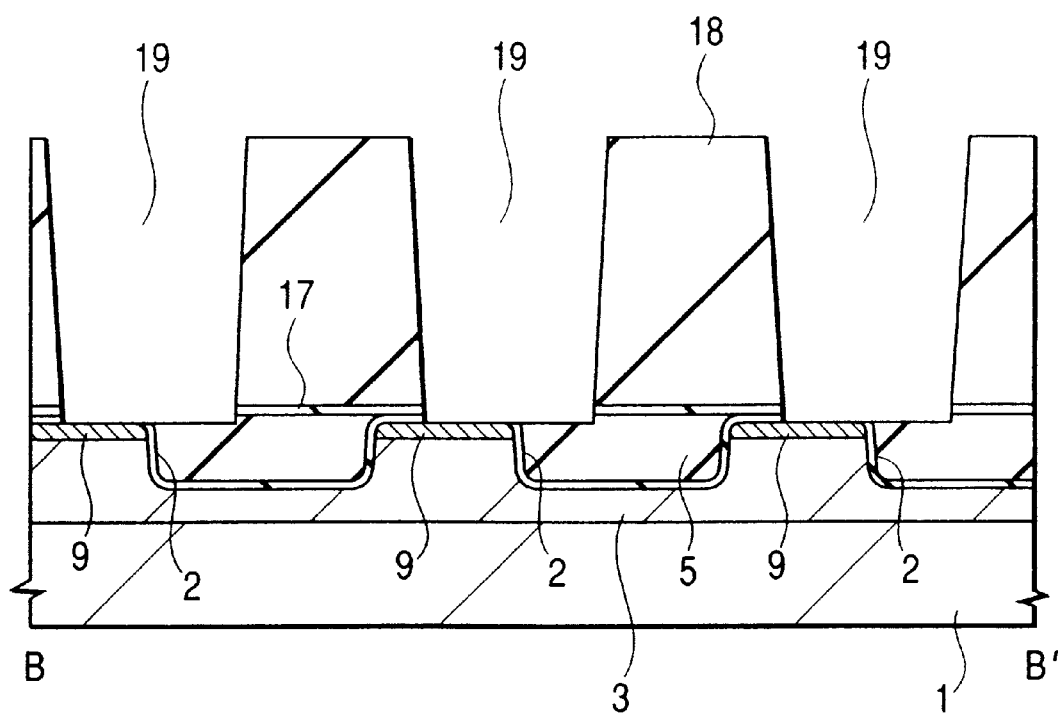
FIG. 12 is a sectional view, taken along line B–B' of FIG. 11, of a part of a major portion of the substrate illustrating another stage in the method of manufacturing the semiconductor integrated circuit device according to the embodiment 1 of the invention.

FIG. 11 is a plan view of the memory region showing a pattern on a plane of the contact hole 19, and FIG. 12 is a sectional view along the line B–B' of FIG. 11. As shown, the contact hole 19 has an elongated pattern on a plane partly extending onto the element isolation groove 2. The contact hole 19 has a diameter of about 540 nm in the direction of long side thereof and a diameter of about 140 nm in the direction of short side thereof.

Referring next to FIG. 13, a plug 21 is buried in the contact hole 19. The plug 21 is buried by, first, wet-washing the interior of the contact hole 19 with a washing solution containing hydrofluoric acid, depositing a low-resistance polycrystalline silicon film (not shown) doped with n-type impurities such as phosphorus (P) in the contact hole 19 and on the silicon oxide film 18 by the CVD method, and removing unnecessary polycrystalline silicon film on the outer side of the contact hole 19 by dry etching. In this embodiment, in this case, the polycrystalline silicon film is over-etched, so that the upper surface of the plug 21 retracts downward by about 150 nm from the upper end of the contact hole 19. The amount of retraction must at least be larger than the thickness of the TiN film (26) deposited on the plug 21 in a subsequent step.

Referring next to FIG. 14, the silicon oxide film 18 in the logic region and the underlying silicon nitride film 17 are dry-etched using a photoresist film (not shown) as a mask, thereby to form a contact hole 23 on the n+-type semiconductor region 13 (source, drain) of the n-channel MISFETQn and to form a contact hole 24 on the p+-type semiconductor region 14 (source, drain) of the p-channel MISFETQp. Here, at the same time, a contact hole 25 is formed on the gate electrode 7C of the p-channel MISFETQp.

Figure 15:
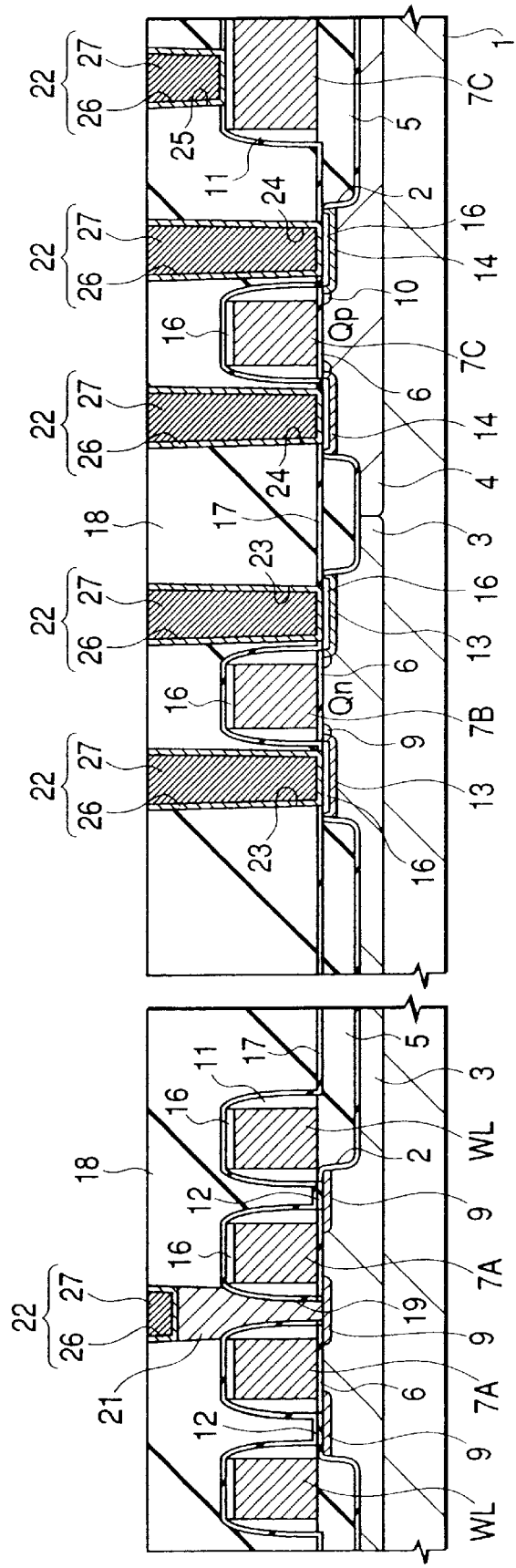
FIG. 15 is a sectional view of a major portion of the substrate illustrating a subsequent stage in the method of manufacturing the semiconductor integrated circuit device according to the embodiment 1 of the invention.
Figure 16:
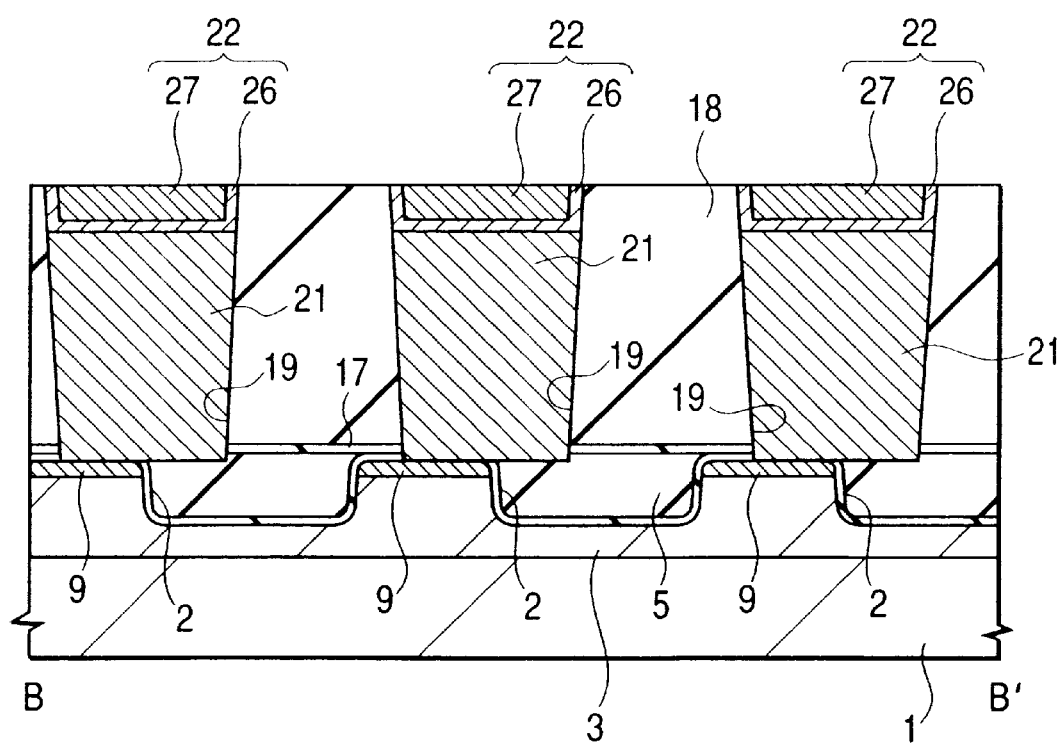
FIG. 16 is a sectional view of a major portion of the substrate illustrating another stage in the method of manufacturing the semiconductor integrated circuit device according to the embodiment 1 of the invention.

Referring, next, to FIGS. 15 and 16 (sectional views of the memory region along the lengthwise direction of the contact hole 19), plugs 22 are buried in the contact holes 23, 24, 25 in the logic region and in the contact hole 19 (upper part of the plug 21) in the memory region. The plugs 22 are buried by successively depositing a TiN film 26 maintaining a thickness of about 30 nm to about 40 nm and a W film 27 maintaining a thickness of about 300 nm in the contact holes 19, 23 to 25 and on the silicon oxide film 18 by the CVD method, and removing unnecessary TiN film 26 and W film 27 on the outer sides of the contact holes 19, 23 to 25 by chemical mechanical polishing method. Upon burying the plugs 22 in the contact holes 23, 24 and 25 in the logic region and in the contact hole 19 in the memory region at the same time, it is allowed to decrease the steps of manufacturing the system LSI mounting the DRAM as well as the logic LSI.

The plug 21 of the polycrystalline silicon has been buried already in the contact hole 19 in the memory region. As described above, however, the upper surface of the plug 21 has been retracted downward from the upper end of the contact hole 19, the amount of retraction being larger than the thickness of the TiN film 26. Therefore, the plug 22 formed in the contact hole 19 (on the plug 21) is constituted by a laminate of the TiN film 26 and the W film 27 like the plugs 22 formed in the contact holes 23 to 25 in the logic region. When the amount of retraction of the plug 21 is set to be equal to, or smaller than, the thickness of the TiN film 26, on the other hand, the W film 27 in the upper part of the contact hole 19 is removed at the time of removing the unnecessary W film 27 on the outer sides of the contact holes 19, 23 to 25 by the chemical polishing method; i.e., the plug 22 formed in the contact hole 19 becomes the one constituted by the TiN film 26 only.

The plugs 22 are chiefly constituted by the W film 27 which is a high-melting metal, and exhibit a low resistance and a high heat resistance. The TiN film 26 under the W film 27 works as a barrier layer that prevents the development of defect (encroachment or worm holes) as a result of the reaction of silicon with the tungsten hexafluoride (WF6) used at the time of depositing the W film 27 by the CVD method, and further works as a barrier layer for preventing the reaction (silicide-forming reaction) of the W film 27 with the substrate 1 in a subsequent step of heat treatment. The TiN film 26 further works as a barrier layer for preventing the formation of a silicide layer having a high resistance on the interface between the metal film (W film) constituting the bit lines on the plugs 22 and the polycrystalline silicon film constituting the plugs 21 as a result of the reaction therebetween in the next step.

Figure 17A:
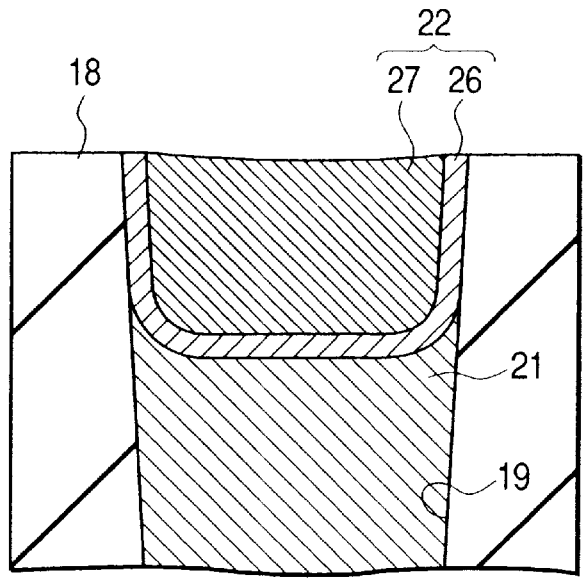
FIGS. 17(a) and 17(b) are sectional views of a part of a major portion of the substrate illustrating a stage in the method of manufacturing the semiconductor integrated circuit device according to the embodiment 1 of the invention.
Figure 17B:
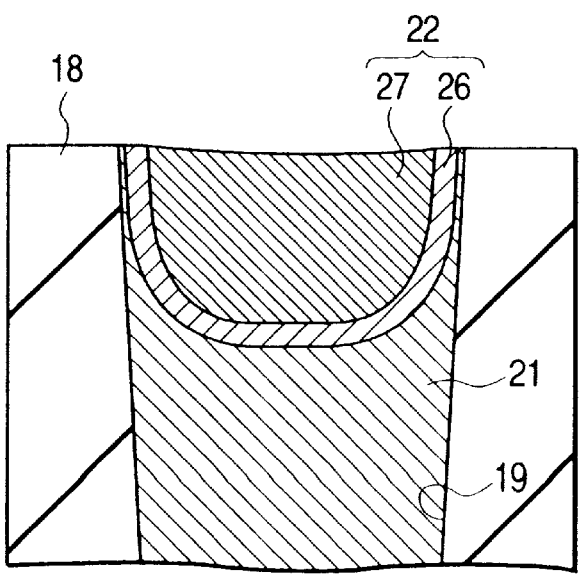

FIG. 17(a) is a sectional view illustrating, on an enlarged scale, the vicinity of the upper end of the contact hole 19 in the memory region where the plug 22 is buried. Usually, when the polycrystalline silicon film deposited in the contact hole 19 is over-etched to have its upper surface retracted, the amount of retraction becomes a maximum at the central portion of the contact hole 19. As shown, therefore, the plug 21 and the TiN film 26 formed thereon come into contact with each other not only on the bottom surface of the TiN film 26 but also on the side surfaces thereof. Depending upon the conditions of etching the polycrystalline silicon film, further, the surface of the polycrystalline silicon film (plug 21) may reach the upper end of the contact hole 19 near the side wall of the contact hole 19 as shown in FIG. 17(b). In this case, though the metal film constituting the bit line comes into contact with the polycrystalline silicon film constituting the plug 21, the contact area between them is so small that no particular trouble occurs.

Figure 18:
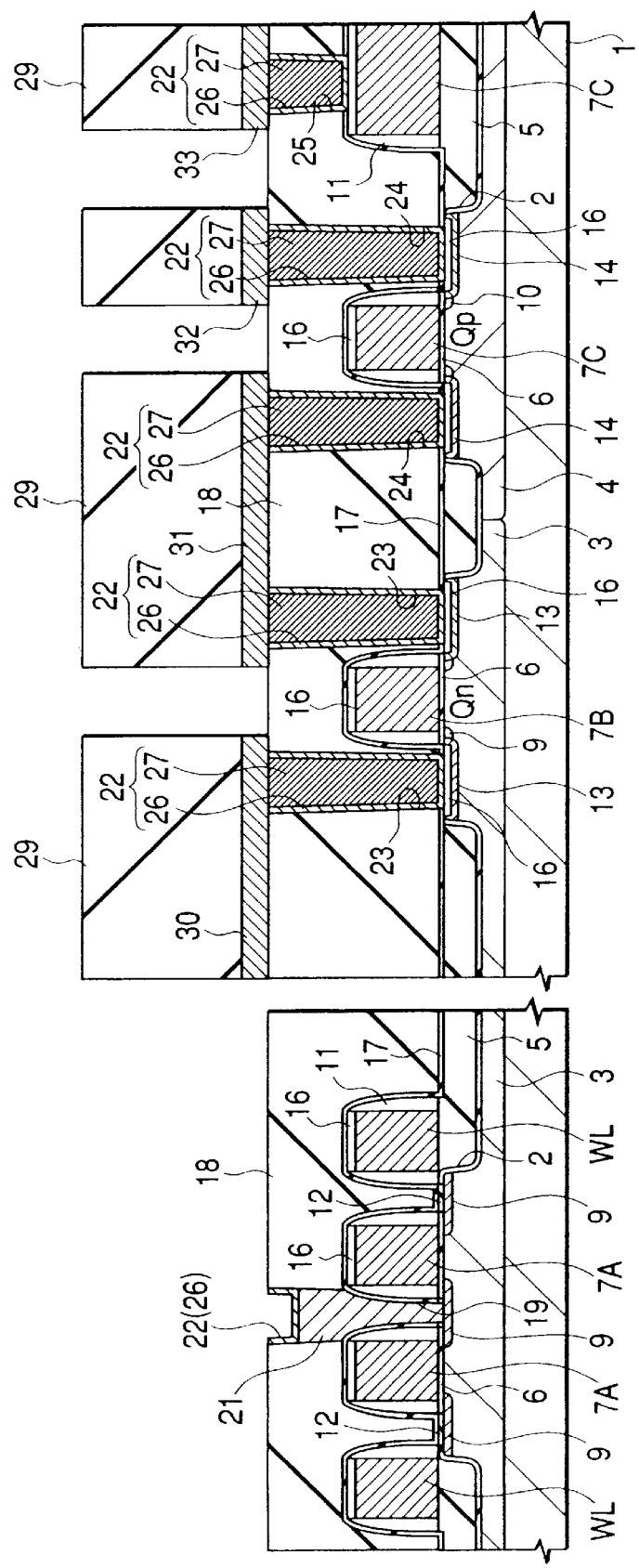
FIG. 18 is a sectional view of a major portion of the substrate illustrating a further stage in the method of manufacturing the semiconductor integrated circuit device according to the embodiment 1 of the invention.
Figure 19:
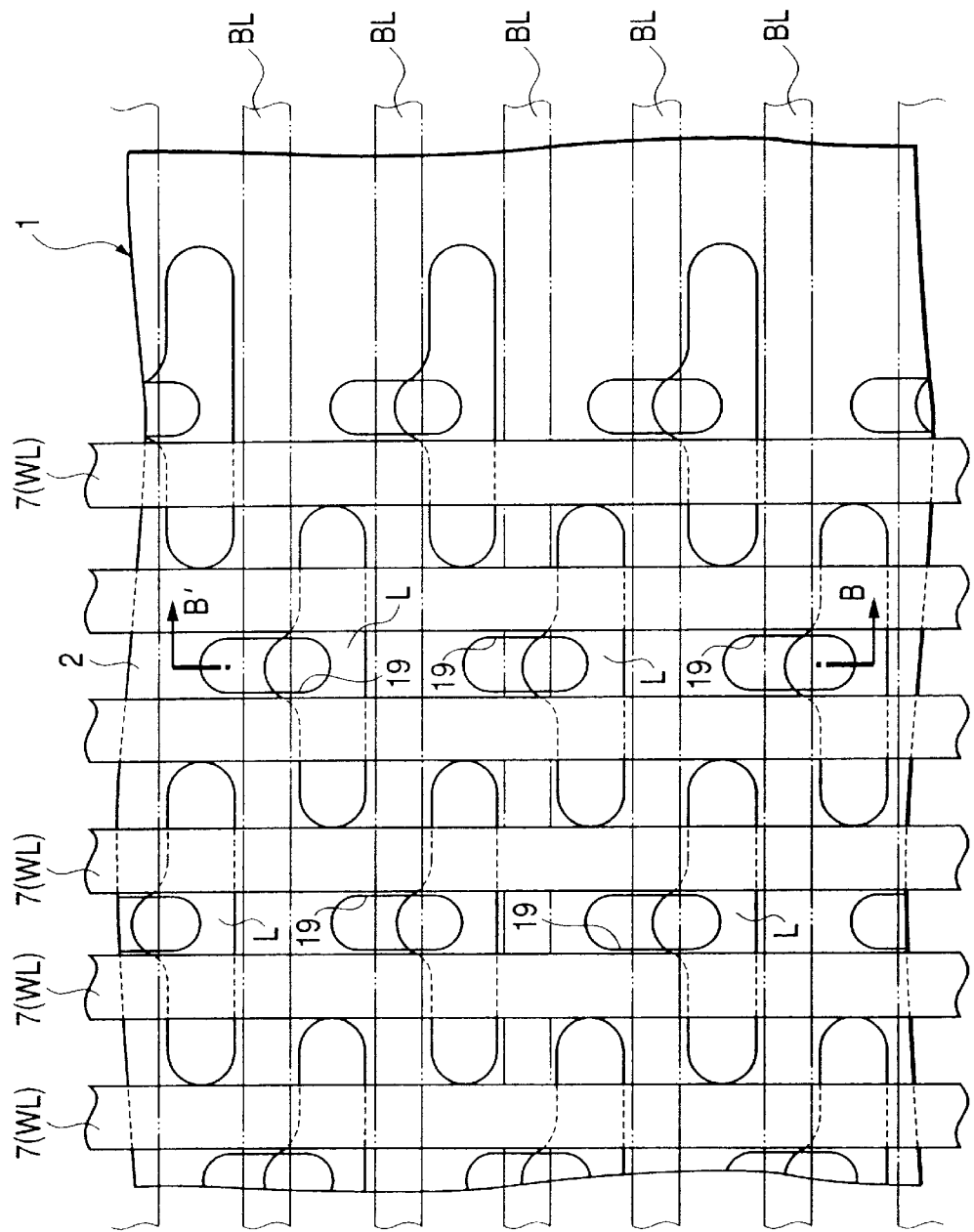
FIG. 19 is a plan view of a major portion of the substrate illustrating the method of manufacturing the semiconductor integrated circuit device according to the embodiment 1 of the invention.
Figure 20:
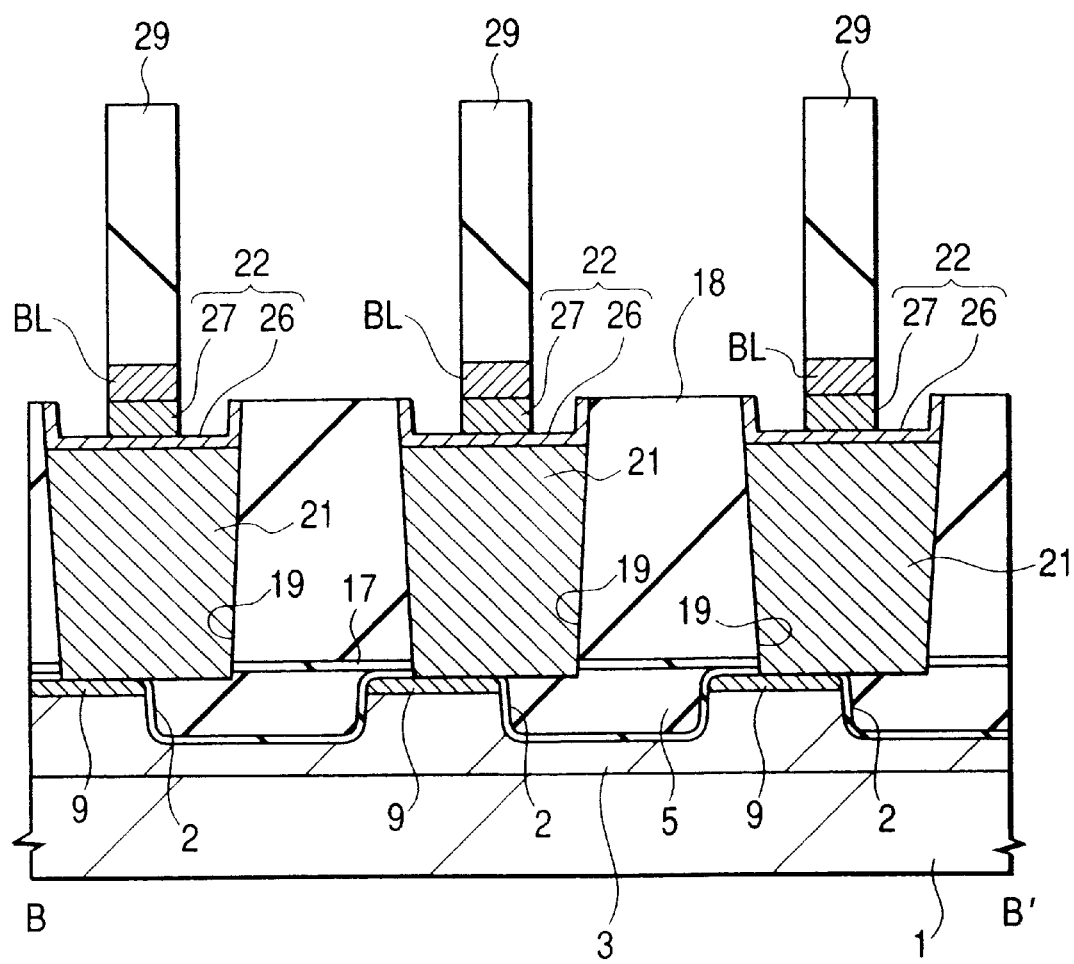
FIG. 20 is a sectional view, taken along line B–B' of FIG. 19, of a major portion of the substrate illustrating a further stage in the method of manufacturing the semiconductor integrated circuit device according to the embodiment 1 of the invention.

Referring next to FIGS. 18, 19 (plan view of the memory region) and FIG. 20 (sectional view along the line B–B' of FIG. 19), bit lines BL are formed on the silicon oxide film 18 in the memory region, and wirings 30, 31, 32 and 33 of the first layer are formed on the silicon oxide film 18 in the logic region.

The bit lines BL and the wirings 30 to 33 are formed by depositing a W film (not shown) maintaining a thickness of about 100 nm by sputtering on the silicon oxide film 18, and patterning the W film by dry etching using a photoresist film 29 as a mask.

In this embodiment, further, the width of the bit line BL is decreased to be smaller than a gap to the neighboring bit line BL in order to decrease the parasitic capacitance among the bit lines BL that becomes conspicuous when the memory cells are realized in a very small size. Referring to FIGS. 19 and 20, the width of the bit line BL is smaller than the diameter of the contact hole 19 along the direction of width (direction of line B–B') of the bit line BL.

In forming the bit line BL by dry-etching the W film, therefore, the W film 27 constituting a portion of the plug 22 is etched, too, in the contact hole 19 as shown in FIG. 20. However, the TiN film 26 constituting another portion of the plug 22 is etched little by a gas (e.g., SF6+C12) that is used for etching the W film, and is not almost etched. Therefore, the polycrystalline silicon film constituting the plug 21 and the TiN film 26 (constituting a portion of the plug 22) formed thereon, come in contact with each other, even after the formation of the bit line BL, over a wide area same as that of before the formation of the bit line BL.

Thus, according to the method of forming bit lines of this embodiment, it is allowed to maintain the contact area between the TiN film 26 and the plug 21 (polycrystalline silicon film) to a sufficient degree and, hence, to prevent an increase in the contact resistance among the bit line BL, plug 22 and plug 21. Even when voids occur in the interface between the TiN film 26 and the plug 21 (polycrystalline silicon film) due to the contraction of volume of the TiN film as a result of heat treatment in the step of production, the contact resistance between the two does not greatly increase, and the bit line BL does not peel off the surface of the plug 21; i.e., reliable connection is maintained among the bit line BL, plug 22 and plug 21.

According to this embodiment, further, since the bit lines BL are constituted by the metal film of a low resistance formed chiefly of W (tungsten), the wirings 30, 31, 32 and 33 of the first layer can be formed simultaneously in the logic region in the step of forming the bit lines BL, contributing to simplifying the steps for manufacturing an LSI mounting a DRAM and a logic LSI.

According to this embodiment in which the plugs 21, 22 of two layers are buried in the contact hole 19 formed in the silicon oxide film 18, and a bit line BL is formed thereon, it is allowed to decrease the number of steps for forming the bit lines compared to that of the conventional process.

Figure 21:
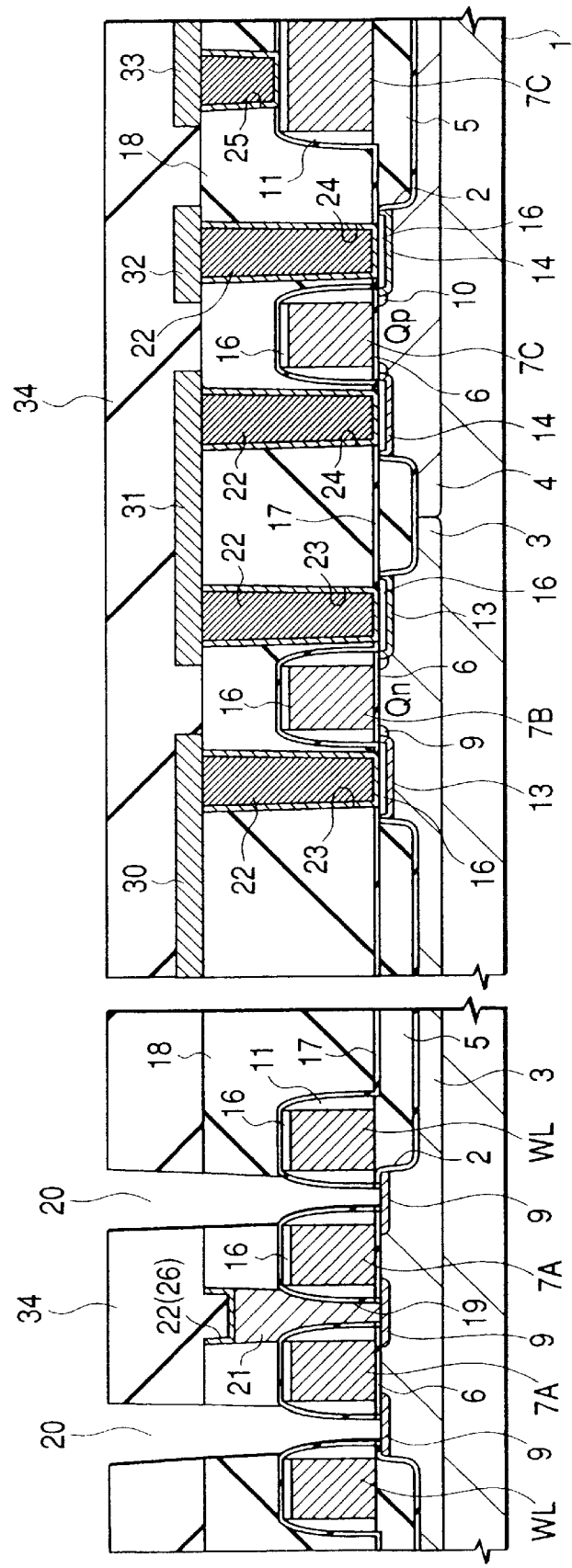
FIG. 21 is a sectional view of a major portion of the substrate illustrating a still further stage in the method of manufacturing the semiconductor integrated circuit device according to the embodiment 1 of the invention.
Figure 22:
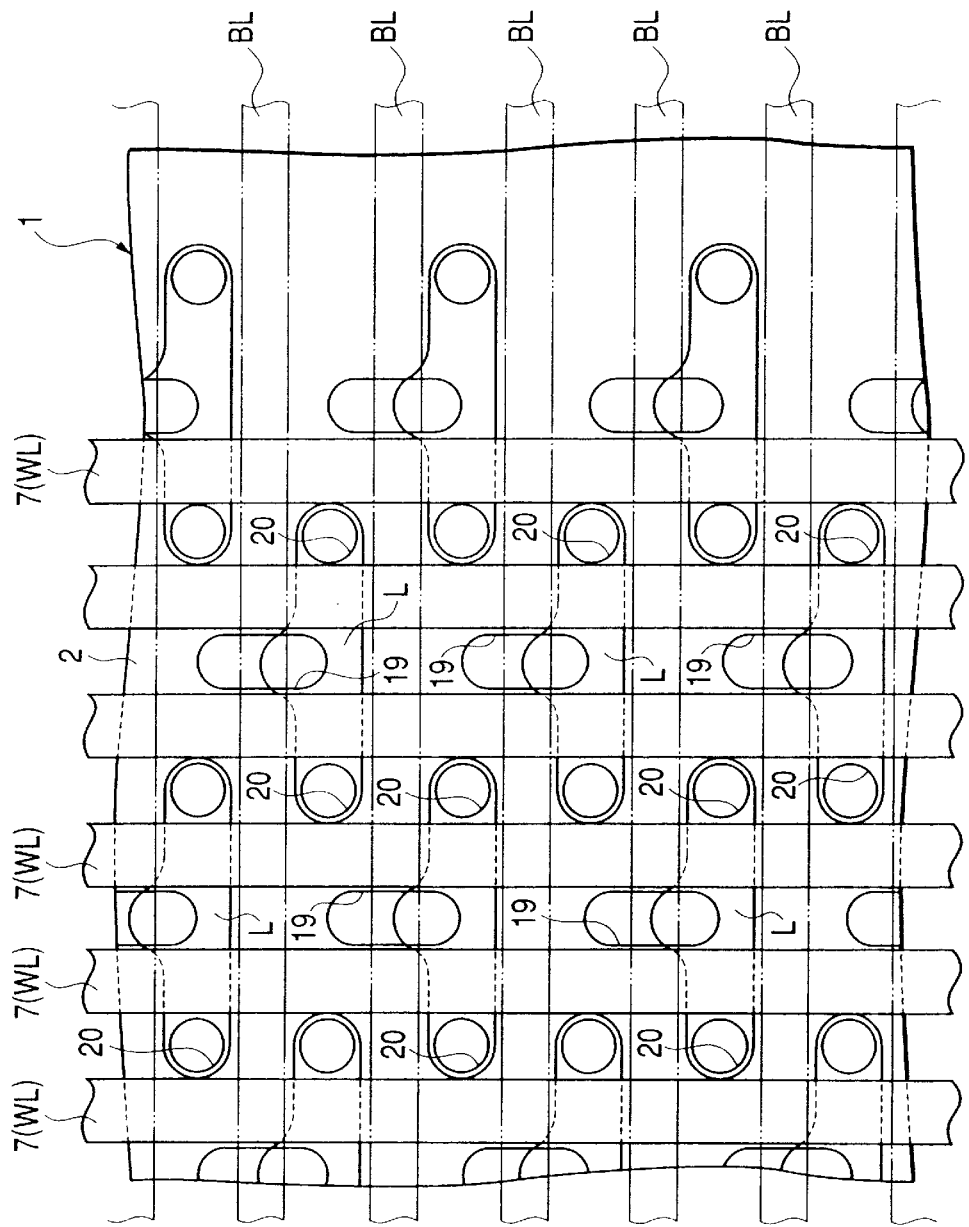
FIG. 22 is a plan view of a major portion of the substrate illustrating a stage in the method of manufacturing the semiconductor integrated circuit device according to the embodiment 1 of the invention.

Referring next to FIGS. 21 and 22 (plan view of the memory region), a silicon oxide film 34 is formed maintaining a thickness of about 300 nm on the bit lines BL and on the wirings 30 to 33 of the first layer. Then, the silicon oxide film 34 in the memory region, the underlying silicon oxide film 18, silicon nitride film 17 and silicon oxide film 12 are successively removed by dry etching, in order to form a contact hole 20 on the n--type semiconductor region 9 to which the bit line BL has not been connected. The contact hole 20 may have a diameter of about 140 nm.

Figure 23:
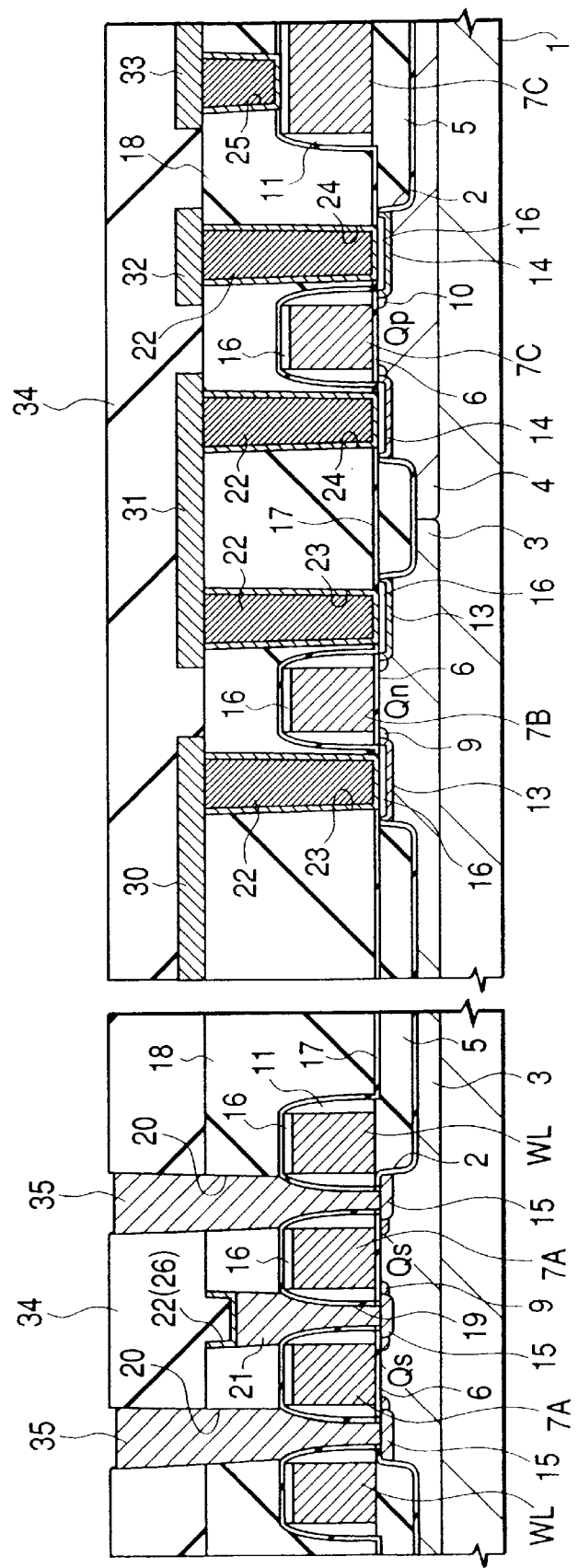
FIG. 23 is a sectional view of a major portion of the substrate illustrating a further stage in the method of manufacturing the semiconductor integrated circuit device according to the embodiment 1 of the invention.

Referrin next to FIG. 23, a plug 35 is buried in the contact hole 20. The plug 35 is buried by, first, wet-washing the interior of the contact hole 20 with a washing solution containing hydrofluoric acid, depositing, by the CVD method, a low-resistance polycrystalline silicon film (not shown) doped with n-type impurities such as phosphorus (P) in the contact hole 20 and on the silicon oxide film 34, and removing the unnecessary polycrystalline silicon film on the outer side of the contact hole 20 by dry-etching.

Next, the substrate 1 is heat-treated so that n-type impurities in the polycrystalline silicon films constituting the plug 21 in the contact hole 19 and the plug 35 in the contact hole 20 are diffused into the substrate 1 (p-type well 3) thereby to form an n+-type semiconductor region 15 (source, drain). Through up to this step, the memory cell-selecting MISFETQs is formed in the memory region.

Figure 24:
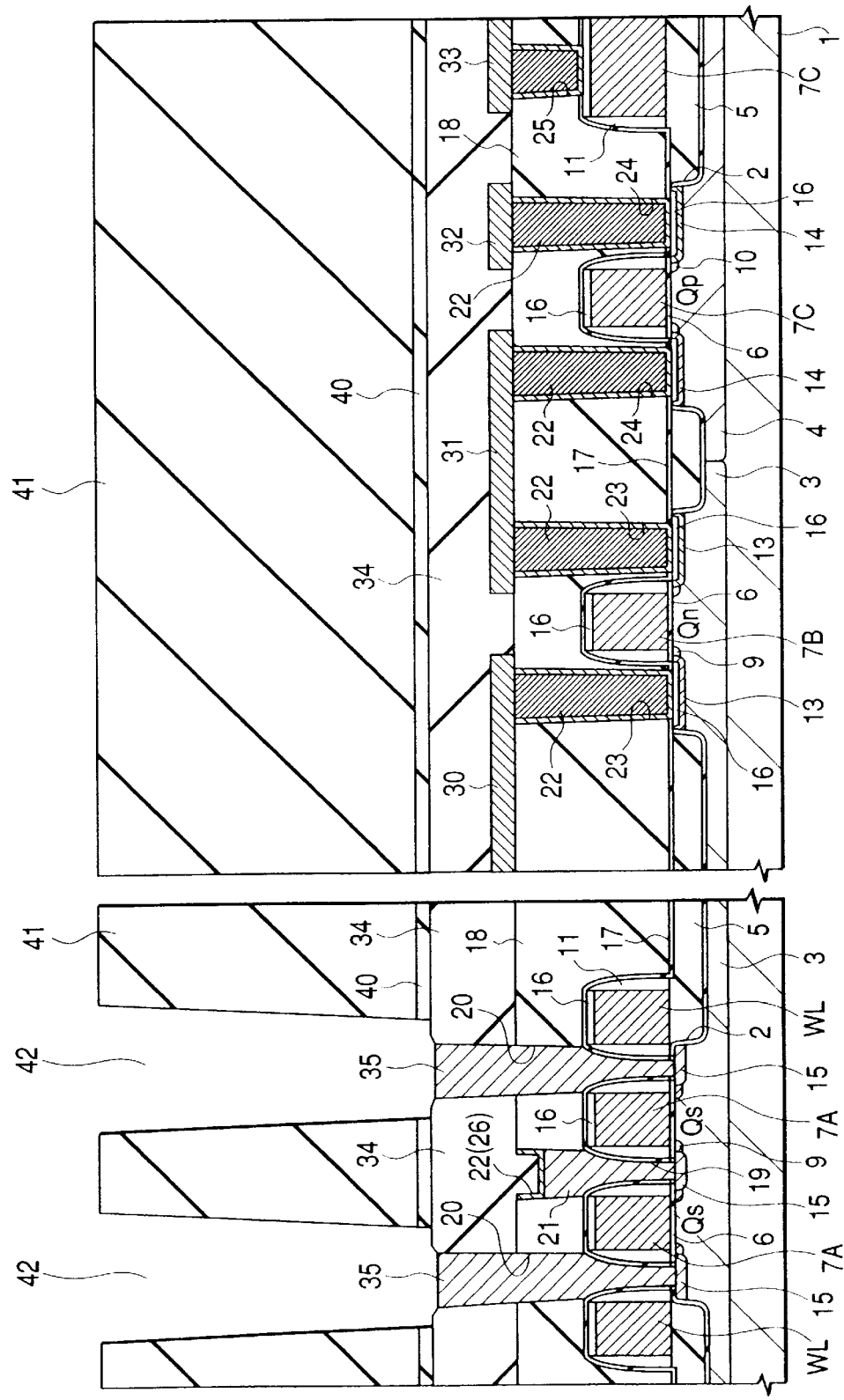
FIG. 24 is a sectional view of a major portion of the substrate illustrating a still further stage in the method of manufacturing the semiconductor integrated circuit device according to the embodiment 1 of the invention.
Figure 44:
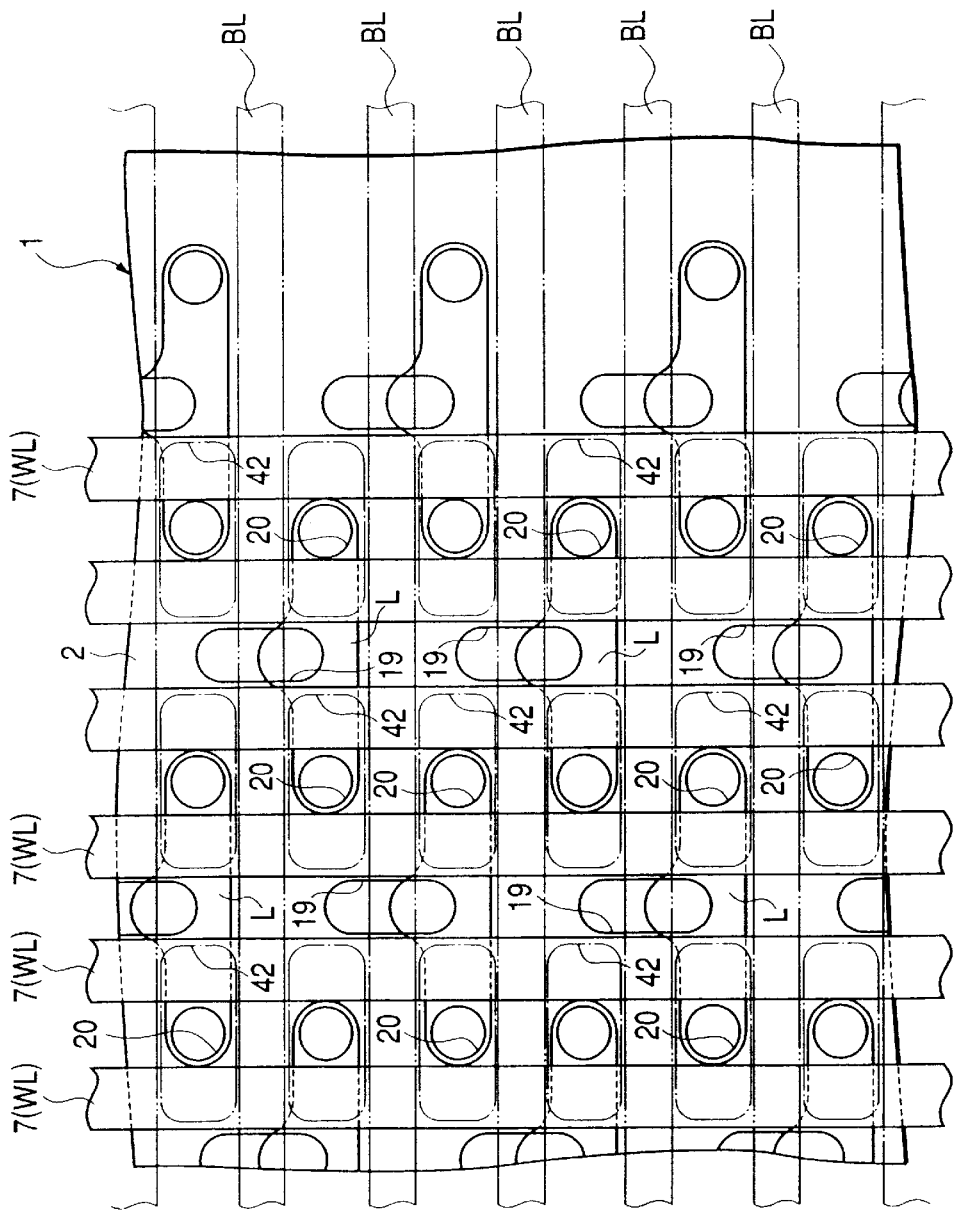
FIG. 44 is a plan view of a major portion of the substrate illustrating the method of manufacturing the semiconductor integrated circuit device according to the embodiment 1 of the invention.

Referring next to FIGS. 24 and 44, a silicon nitride film 40 is deposited maintaining a thickness of about 100 nm by the CVD method on a silicon oxide film 34 and, then, a silicon oxide film 41 is deposited on the silicon nitride film 40 by the CVD method. Then, by using a photoresist film (not shown) as a mask, the silicon oxide film 41 in the memory region and the underlying silicon nitride film 40 are dry etched to form a groove 42 on the contact hole 20. The lower electrode of the data-storing capacitor element is formed along the inner wall of the groove 42. In order to increase the storing amount of electric charge by increasing the surface area of the lower electrode, therefore, the silicon oxide film 41 forming the groove 42 must be deposited maintaining a large thickness (e.g., about 1.3 μm).

Figure 25:
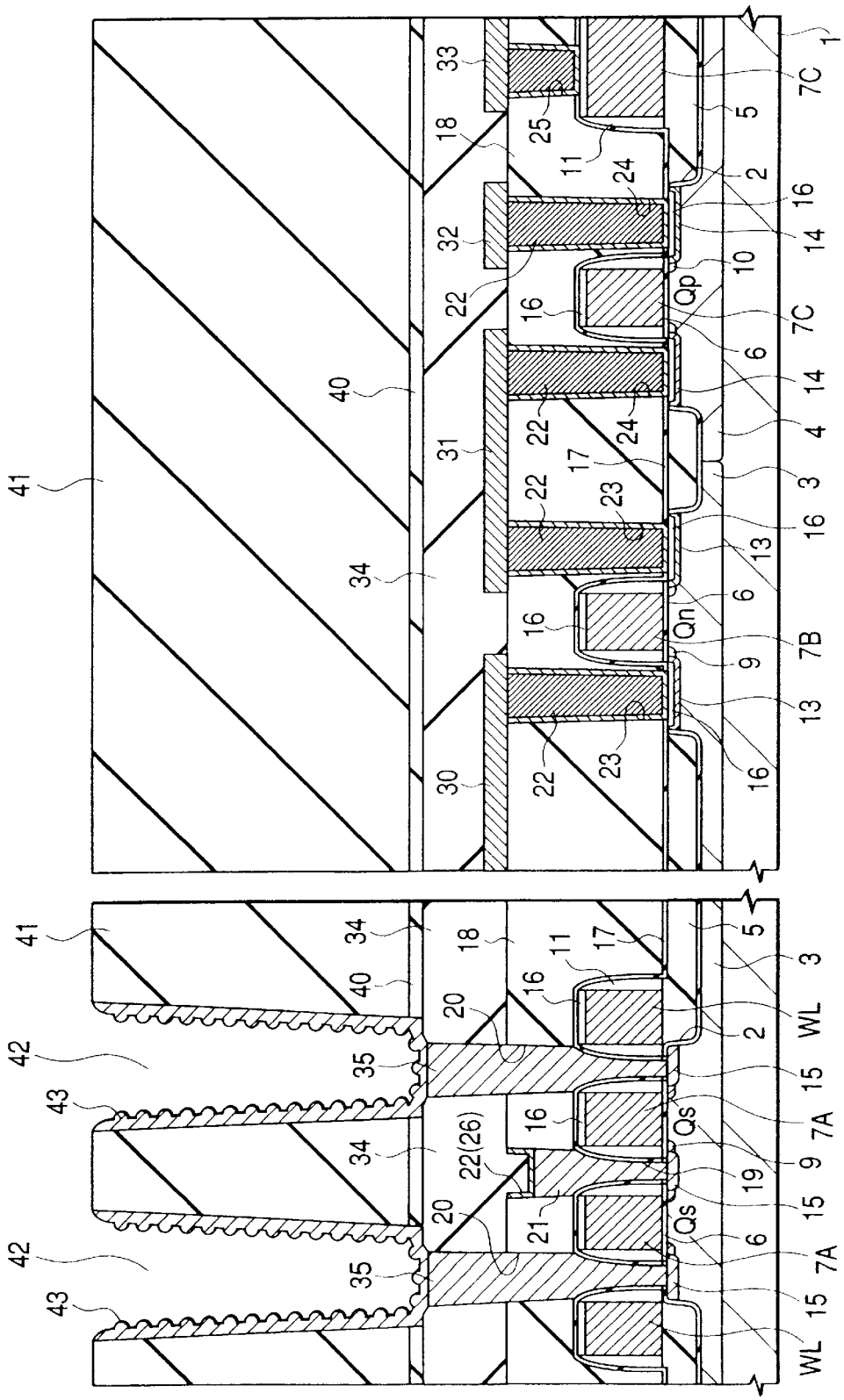
FIG. 25 is a sectional view of a major portion of the substrate illustrating another stage in the method of manufacturing the semiconductor integrated circuit device according to the embodiment 1 of the invention.

Referring next to FIG. 25, a polycrystalline silicon film 43 is formed in the groove 42 so as to be used as the lower electrode of the data-storing capacitor element. The polycrystalline silicon film 43 is formed by, first, depositing, by the CVD method, an amorphous silicon film (not shown) doped with n-type impurities (phosphorus) maintaining a thickness of about 50 nm in the groove 42 and on the silicon oxide film 41 and, then, removing the unnecessary amorphous silicon film on the outer side of the groove 42 by dry etching.

Next, the surface of the amorphous silicon film remaining in the groove 42 is wet-washed with a hydrofluoric acid-type washing solution, the substrate 1 is heat-treated while feeding monosilane (SiH4) onto the surface of the amorphous silicon film in a reduced-pressure atmosphere thereby to polycrystallize the amorphous silicon film and to grow silicon particles on the surfaces thereof. Thus, the polycrystalline silicon film 43 having a coarse surface is formed along the inner wall of the groove 42.

Figure 26:
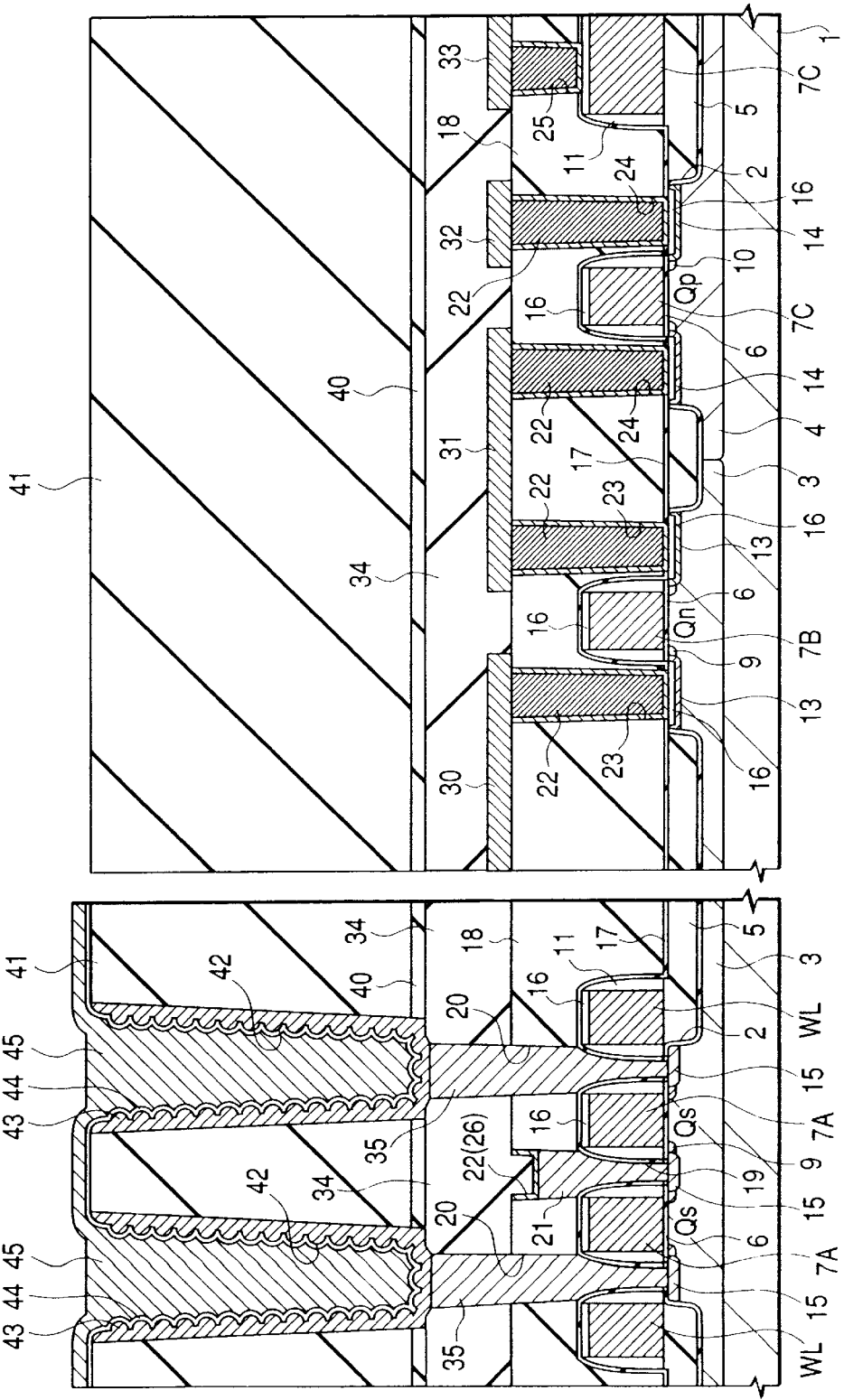
FIG. 26 is a sectional view of a major portion of the substrate illustrating still another stage in the method of manufacturing the semiconductor integrated circuit device according to the embodiment 1 of the invention.

Referring next to FIG. 26, a tantalum oxide (Ta2O5) film 44 is deposited by the CVD method maintaining a thickness of about 15 nm in the groove 42 and on the silicon oxide film 41 and, then, a TiN film 45 is deposited maintaining a thickness of about 150 nm in the groove 42 and on the tantalum oxide film 44 by the CVD method and sputtering method. Thereafter, the TiN film 45 and the tantalum oxide film 44 are dry etched using a photoresist film (not shown) as a mask. There is thus formed a data-storing capacitor element C constituted by an upper electrode of TiN film 45, a capacitor insulating film of tantalum oxide film 44 and a lower electrode of polycrystalline silicon film 43. Through up to this step, further, there is nearly completed a memory cell of DRAM constituted by the memory cell-selecting MISFETQs and the data-storing capacitor element C connected in series therewith.

The capacitor insulating film of the data-storing capacitor element C may be constituted by a ferroelectric substance having a crystal structure of the perovskite type or of the composite perovskite type, such as PZT, PLT, PLZT, PbTiO3, SrTiO3, BaTiO3, BST or SBT, or may be constituted by an insulating film containing the ferroelectric substance as a main component, in addition to the above tantalum oxide film 44.

Figure 27:
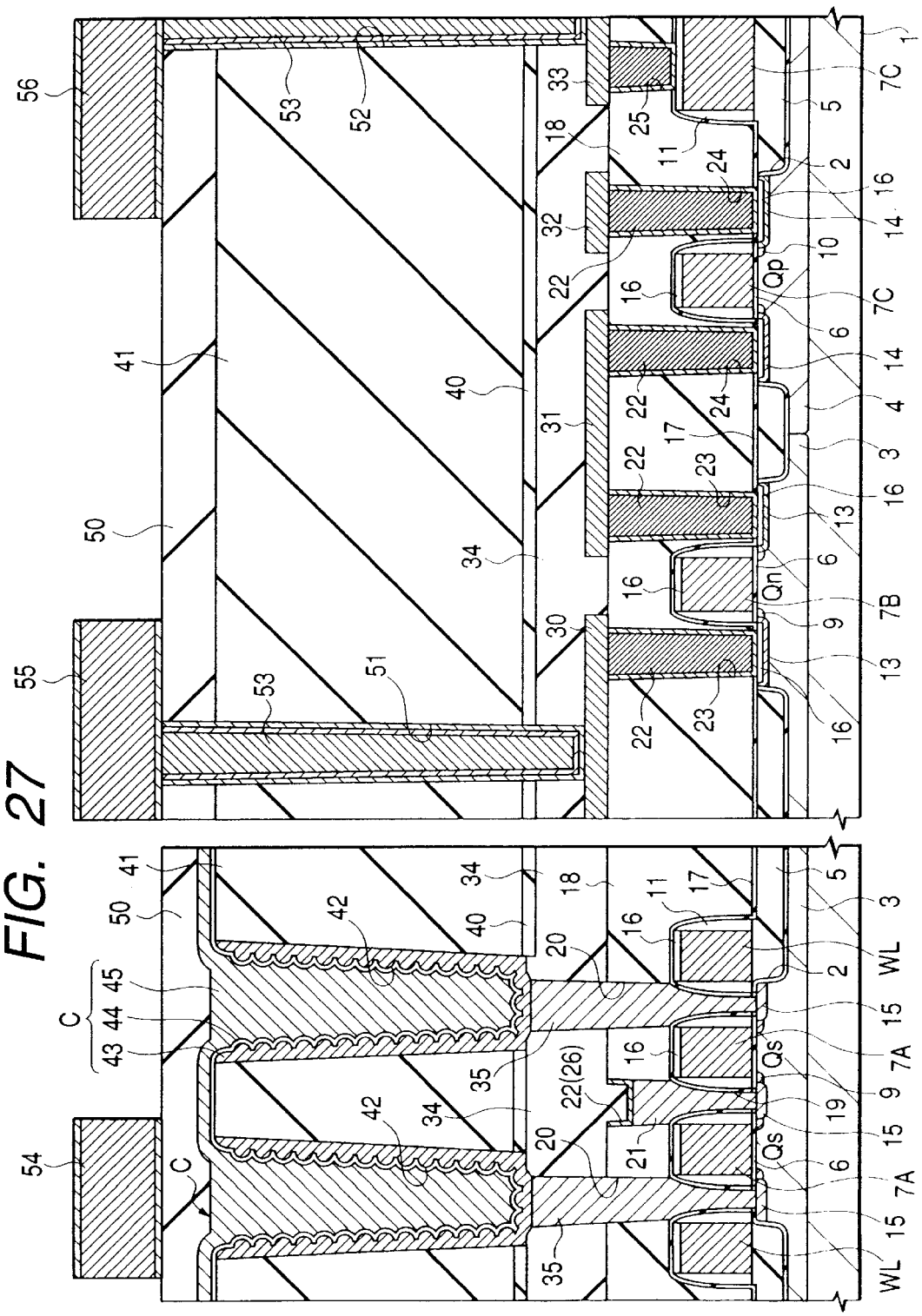
FIG. 27 is a sectional view of a major portion of the substrate illustrating a still further stage in the method of manufacturing the semiconductor integrated circuit device according to the embodiment 1 of the invention.

Referring next to FIG. 27, a silicon oxide film 50 is deposited maintaining a thickness of about 100 nm by the CVD method on the data-storing capacitor element C. Then, the silicon oxide films 50, 41, silicon nitride film 40 and silicon oxide film 34 on the wirings 30, 33 in the logic region are dry etched to form through holes 51, 52. Thereafter, plugs 53 are formed in the through holes 51, 52. The plugs 53 are formed by depositing a TiN film maintaining a thickness of about 100 nm on the silicon oxide film 50 by the sputtering method, depositing a W film therein maintaining a thickness of about 500 nm by the CVD method, and removing the unnecessary W film and the TiN film on the outer sides of the through holes 51, 52 by dry etching.

Next, wirings 54 to 56 of the second layer are formed on the silicon oxide film 50. The wirings 54 to 56 are formed by depositing, by sputtering, a TiN film maintaining a thickness of about 50 nm, an Al (aluminum) alloy film maintaining a thickness of about 500 m and a Ti film maintaining a thickness of about 50 nm on the silicon oxide film 50, and dry-etching these films by using a photoresist film (not shown) as a mask.

Thereafter, though not diagramed, plural wiring layers are formed with an interlayer insulating film sandwiched among them on the wirings 54 to 56. The system LSI of the embodiment is nearly completed through the above step.

An embodiment 2 of the invention will be described with reference to FIGS. 28 to 35.

Figure 28:
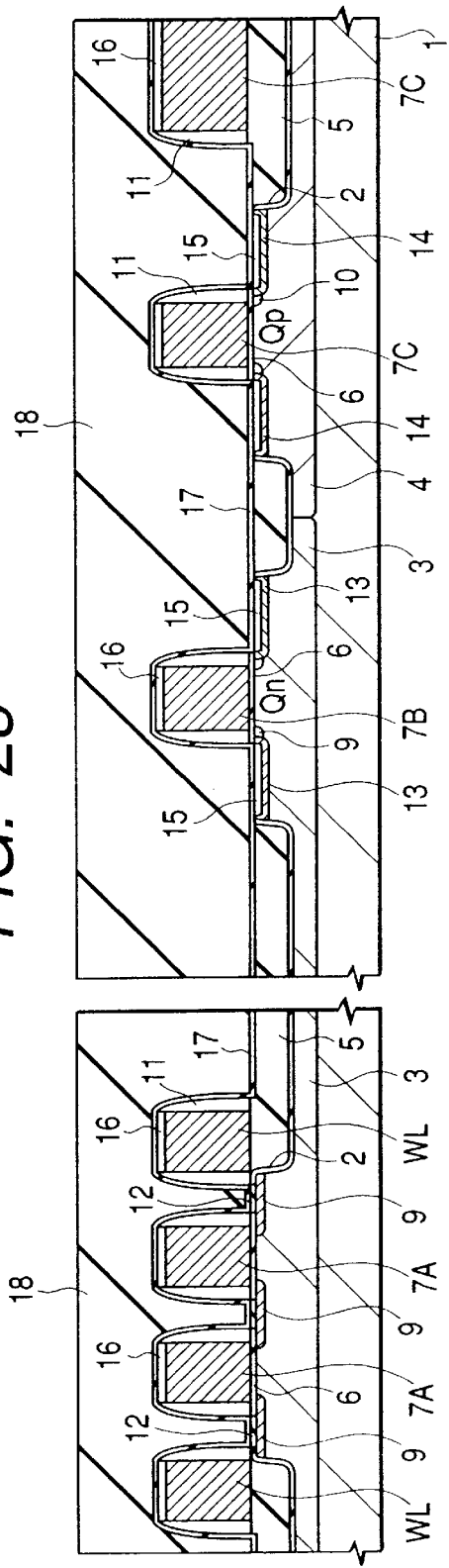
FIG. 28 is a sectional view of a major portion of the substrate illustrating a stage in the method of manufacturing the semiconductor integrated circuit device according to an embodiment 2 of the invention.

The bit line BL can be formed by the following method. Referring, first, to FIG. 28, a silicon nitride film 17 and a silicon oxide film 18 are successively deposited on the gate electrode 7A (word line WL) and on the gate electrodes 7B, 7C in the logic region and, then, the surface of the silicon oxide film 18 is flattened by the chemical mechanical polishing method. The process up to this step is the same as that of the steps of the embodiment 1 shown in FIGS. 2 to 9.

Figure 29:
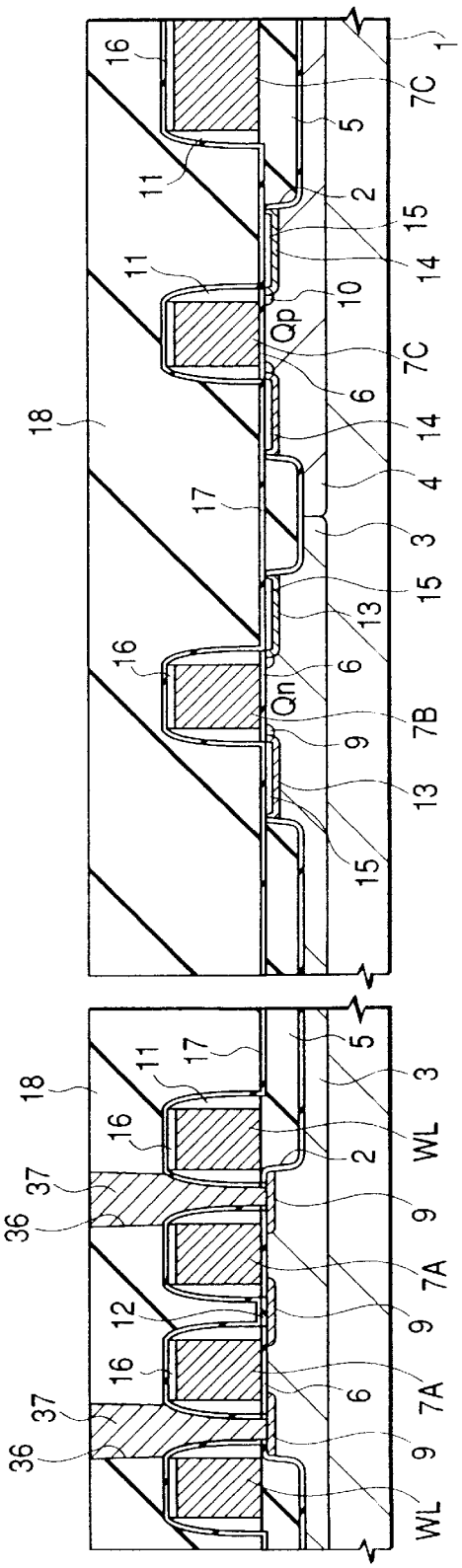
FIG. 29 is a sectional view of a major portion of the substrate illustrating a further stage in the method of manufacturing the semiconductor integrated circuit device according to the embodiment 2 of the invention.

Referring next to FIG. 29, the silicon oxide film 18, silicon nitride film 17 and silicon oxide film 12 in the memory region are dry-etched to form a contact hole 36 on the n--type semiconductor region 9 to which will be connected a data-storing capacitor element C in a subsequent step and, then, a plug 37 constituted by a polycrystalline silicon film is buried in the contact hole 36. The plug 37 is buried by depositing a polycrystalline silicon film (not shown) of a low resistance doped with n-type impurities such as phosphorus (P) in the contact hole 36 and on the silicon oxide film 18 and, then, removing unnecessary polycrystalline silicon film on the outside of the contact hole 36 by dry etching.

Referring next to FIG. 30, a silicon oxide film 28 is deposited maintaining a thickness of about 200 nm on the silicon oxide film 18 by the CVD method. Then, the silicon oxide films 28 and 18, silicon nitride film 17 and silicon oxide film 12 in the memory region are dry-etched to form a contact hole 19 on the n--type semiconductor region 9 to which the bit line will be connected in a subsequent step. Like the contact hole 19 of the embodiment 1, this contact hole 19 has a fine elongated pattern on a plane partly extending onto the element isolation groove 2 (see FIGS. 11 and 12).

Next, a plug 21 is buried in the contact hole 19. The plug 21 is buried by depositing a polycrystalline silicon film (not shown) of a small resistance doped with n-type impurities such as phosphorus (P) in the contact hole 19 and on the silicon oxide film 28, and removing the unnecessary polycrystalline silicon film on the outer side of the contact hole 19 by dry etching. In this case, like in the embodiment 1, the polycrystalline silicon film is over-etched, so that the upper surface of the plug 21 is retracted downward from the upper end of the contact hole 19. The amount of retraction must not be smaller than the thickness of the TiN film 26 deposited on the plug 21 in a subsequent step.

Next, the substrate 1 is heat-treated so that the n-type impurities in the polycrystalline silicon film constituting the plug 21 in the contact hole 19 and the plug 37 in the contact hole 36 diffuse into the substrate 1 (p-type well 3), thereby to form an n+-type semiconductor region 15 (source, drain). Through up to this step, a memory cell-selecting MISFETQs is formed in the memory region.

Referring next to FIG. 31, the silicon oxide films 28 and 18 in the logic region and the underlying silicon nitride film 17 are dry-etched using a photoresist film (not shown) as a mask, to form a contact hole 23 on the n+-type semiconductor region 13 (source, drain) of the n-channel MISFETQn and to form a contact hole 24 on the p+-type semiconductor region 14 (source, drain) of the p-channel MISFETQp. At this time, a contact hole 25 is formed on the gate electrode 7C of the p-channel MISFETQp.

Next, plugs 22 constituted by a laminate of a TiN film 26 and a W film 27 are buried in the contact holes 23, 24 and 25 in the logic region and in the contact hole 19 (on the plug 21) in the memory region in the same manner as in the embodiment 1.

Figure 33:
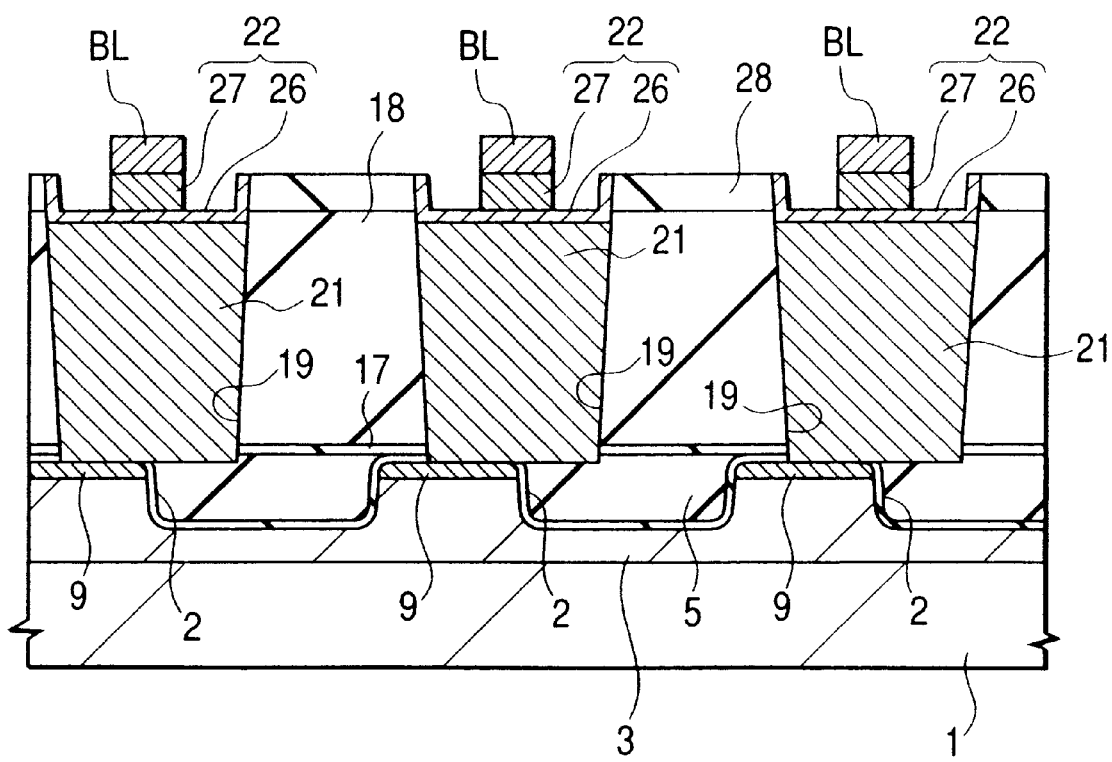
FIG. 33 is a sectional view of a part of a major portion of the substrate illustrating a stage in the method of manufacturing the semiconductor integrated circuit device according to the embodiment 2 of the invention.

Referring next to FIGS. 32 and 33 (sectional views of the memory region along the lengthwise direction of the contact hole 19), a bit line BL is formed on the silicon oxide film 28 in the memory region by the same method as that of the embodiment 1, and the wirings 30, 31, 32 and 33 of the first layer are formed on the silicon oxide film 28 in the logic region.

In forming the bit line BL as shown in FIG. 33, the W film 27 constituting a portion of the plug 22 in the contact hole 19 is etched. However, the TiN film 26 constituting another portion of the plug 22 is little etched by the gas used for etching the W film, and is not almost removed. Accordingly, the polycrystalline silicon film and the TiN film 26 formed thereon (constituting a portion of the plug 22), that are constituting the plug 21, are contacted to each other over a wide area same as before the bit line BL is formed even after it is formed.

Figure 34:
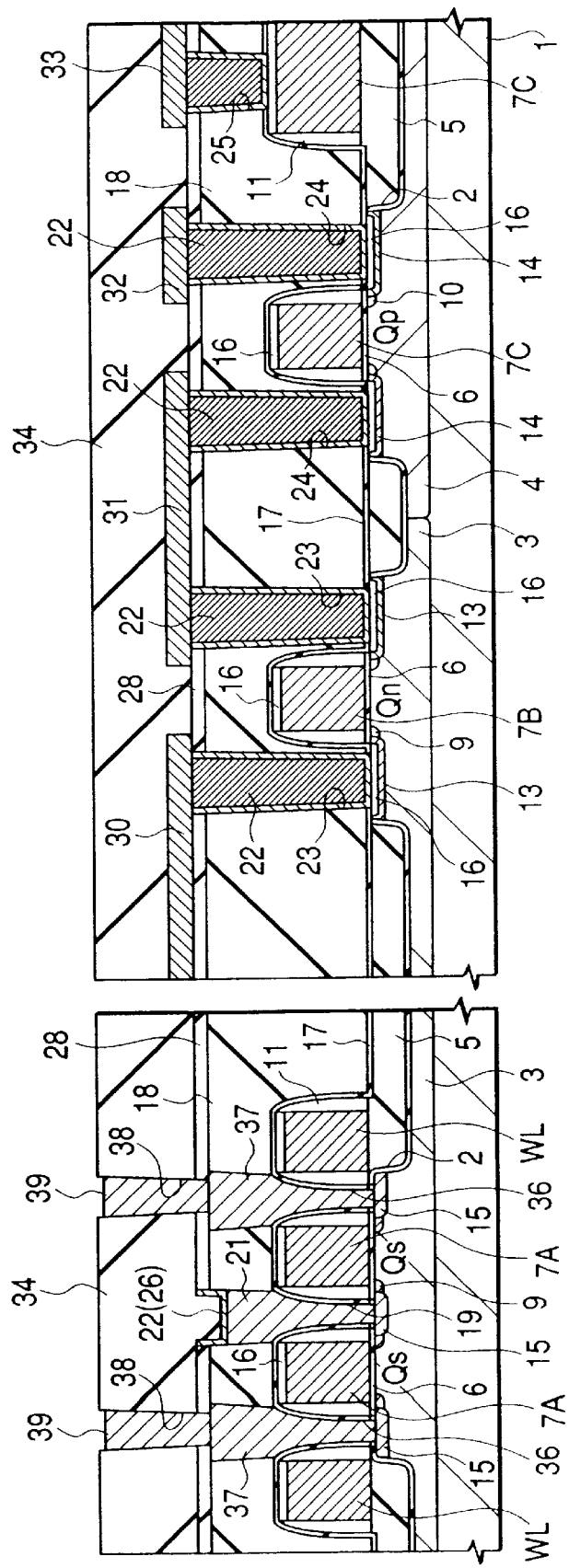
FIG. 34 is a sectional view of a major portion of the substrate illustrating another stage in the method of manufacturing the semiconductor integrated circuit device according to the embodiment 2 of the invention.

Referring next to FIG. 34, a silicon oxide film 34 is formed on the wirings 30 to 33 of the first layer and on the bit line BL that is not shown. Then, a contact hole 38 is formed in the silicon oxide films 34 and 28 over the contact hole 36 in the memory region, and a plug 39 is buried in the contact hole 38. The plug 39 is buried by depositing a polycrystalline silicon film (not shown) of a low resistance doped with n-type impurities such as phosphorus (P) in the contact hole 38 and on the silicon oxide film 34, and removing the unnecessary polycrystalline silicon film on the outer side of the contact hole 38 by dry etching.

Figure 35:
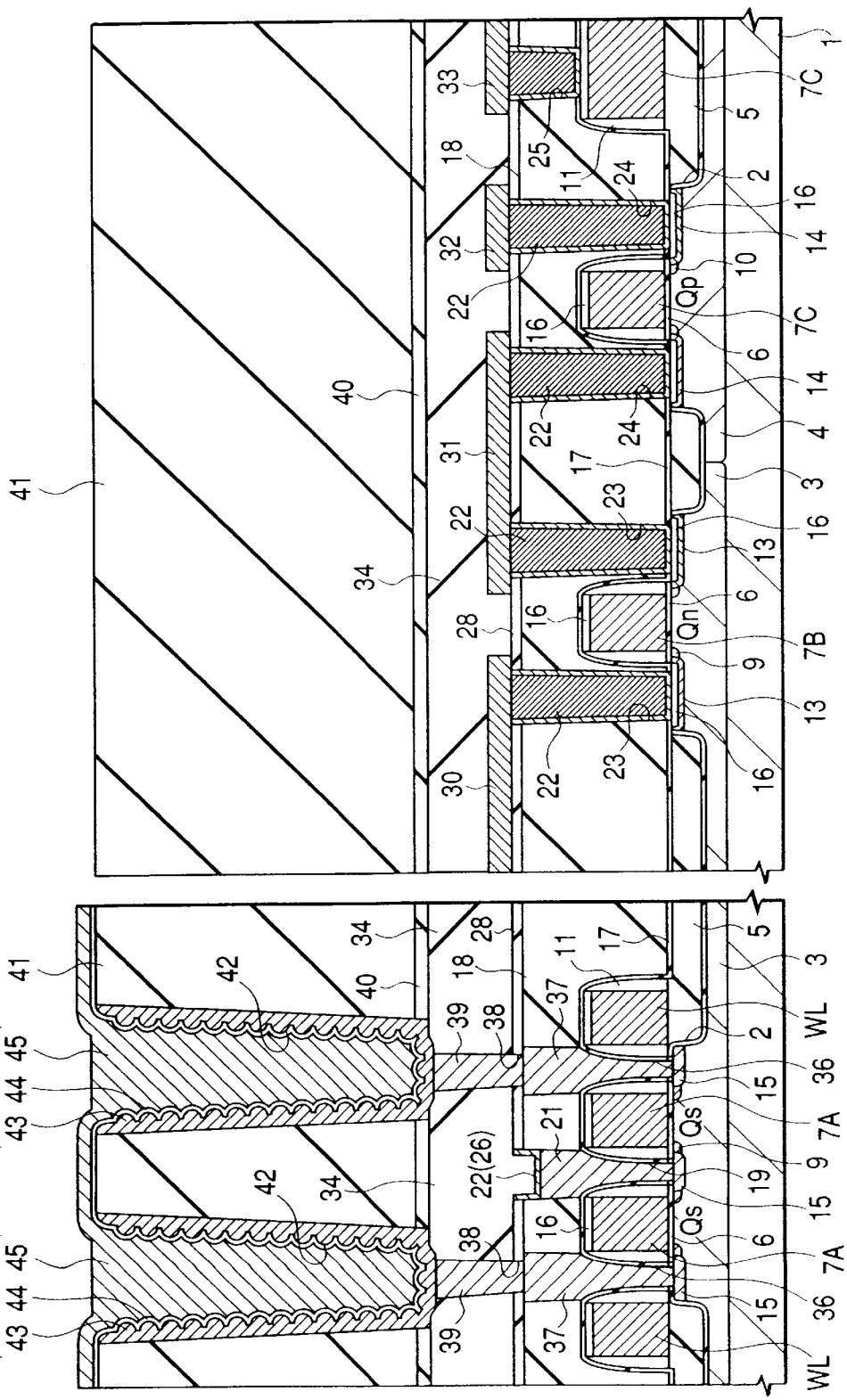
FIG. 35 is a sectional view of a major portion of the substrate illustrating a further stage in the method of manufacturing the semiconductor integrated circuit device according to the embodiment 2 of the invention.

Referring next to FIG. 35, a silicon nitride film 40 and a silicon oxide film 41 are successively deposited on the silicon oxide film 34 and, then, a groove 42 is formed in the silicon oxide film 41 and in the silicon nitride film 40 in the memory region.

Then, a lower electrode constituted by a polycrystalline silicon film 43 and a capacitor insulating film constituted by a tantalum oxide film 44 are formed in the groove 42 according to the same method as the embodiment 1, and an upper electrode constituted by a TiN film 45 is formed thereon to nearly complete a memory cell of DRAM constituted by the memory cell-selecting MISFETQs and the data-storing capacitor element C connected in series therewith. The subsequent steps are the same as those of the above embodiment 1.

According to the manufacturing method of this embodiment, the plug 21 in the contact hole 19 and the plug 37 in the contact hole 36 are formed simultaneously. Therefore, a silicon oxide film 28 is necessary for maintaining electric insulation between the bit line BL formed on the contact hole 19 and the plug 37 in the contact hole 36, and the number of the steps increases correspondingly compared to that of the embodiment 1.

In this case, too, the contact area is maintained sufficiently great between the TiN film 26 in the contact hole 19 and the plug 21 (polycrystalline silicon film) preventing an increase in the contact resistance among the bit line BL, plug 22 and plug 21 like in the embodiment 1. Even in case voids occur in the interface between the TiN film 26 and the plug 21 (polycrystalline silicon film) due to the contraction of volume of the TiN film caused by the heat treatment executed in the step of manufacturing, the contact resistance does not greatly increase between the two or the bit line BL does not peel off the surface of the plug 21. Accordingly, a reliable connection is maintained among the bit line BL, plug 22 and plug 21.

Upon forming the plugs which are divided into plural stages to electrically connect the lower electrodes of the data-storing capacitor elements to the memory cell-selecting MISFETs, it is allowed to decrease the aspect ratio of the contact holes and to increase the coverage of the polycrystalline silicon film having a low resistance.

An embodiment 3 of the invention will be described with reference to FIGS. 36 to 43 and FIG. 45.

Figure 36:
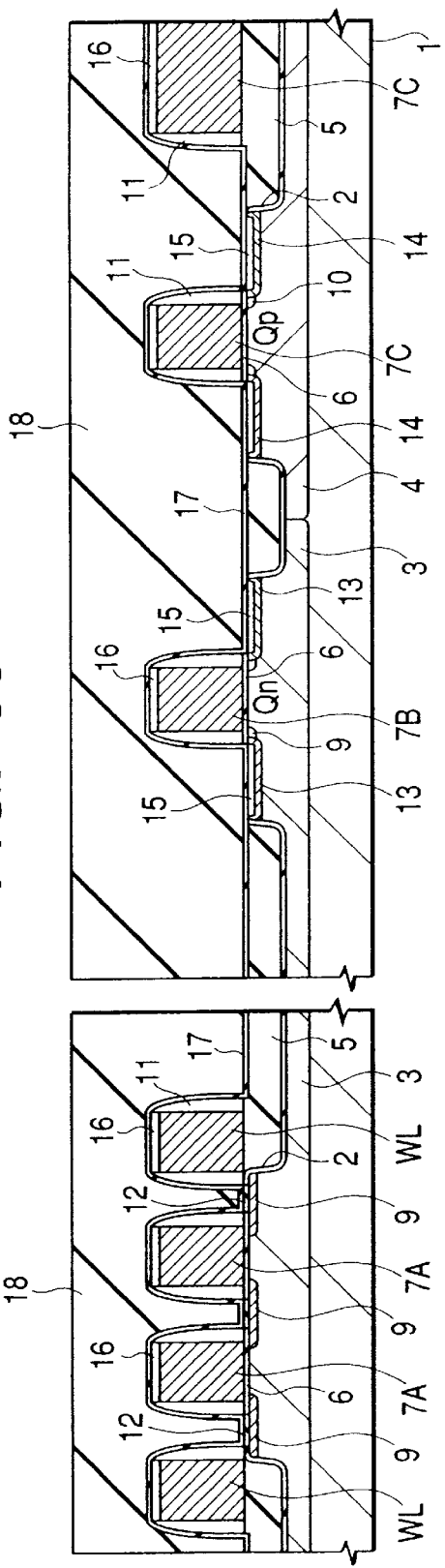
FIG. 36 is a sectional view of a major portion of the substrate illustrating a stage in the method of manufacturing the semiconductor integrated circuit device according to an embodiment 3 of the invention.

The bit line BL can also be formed by the following method. Referring, first, to FIG. 36, a silicon nitride film 17 and a silicon oxide film 18 are successively deposited on the gate electrode 7A (word line WL) and on the gate electrodes 7B, 7C in the logic region. The surface of the silicon oxide film 18 is, then, flattened by the chemical mechanical polishing method. The process up to this step is the same as the steps of the embodiment 1 shown in FIGS. 2 to 9.

Figure 37:
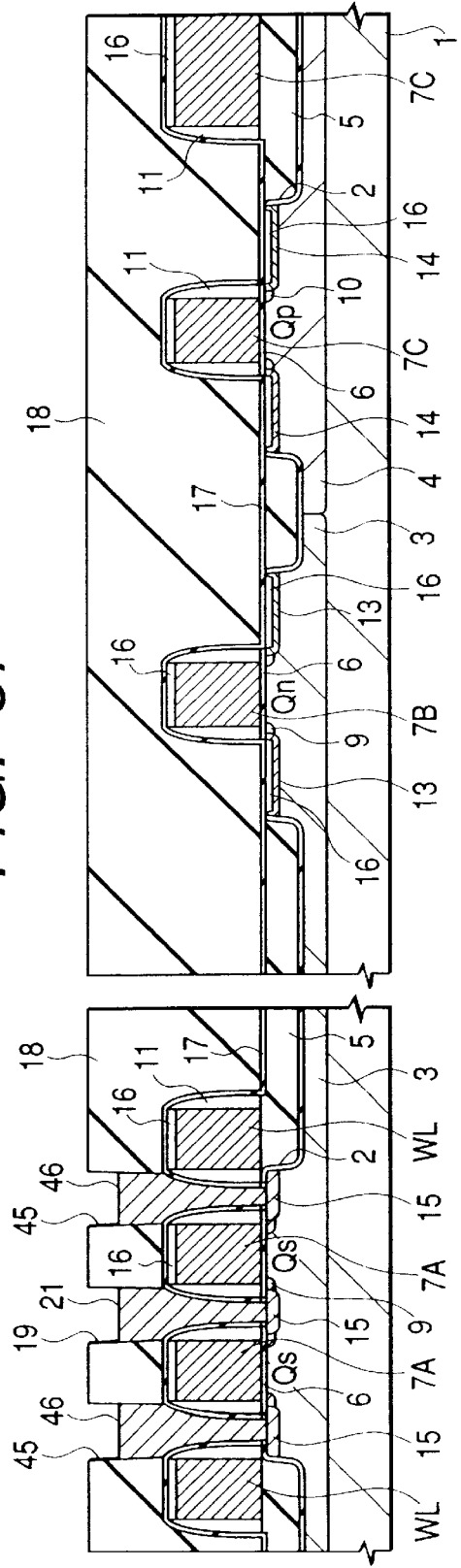
FIG. 37 is a sectional view of a major portion of the substrate illustrating a subsequent stage in the method of manufacturing the semiconductor integrated circuit device according to the embodiment 3 of the invention.

Referring next to FIG. 37, the silicon oxide film 18, silicon nitride film 17 and silicon oxide film 12 in the memory region are dry-etched to form a contact hole 19 on the n--type semiconductor region 9 to which will be connected a bit line BL in a subsequent step and to form a contact hole 45 on the n--type semiconductor region 9 to which will be connected a data-storing capacitor element C in a subsequent step. Thereafter, plugs 21, 46 constituted by the polycrystalline silicon film are buried in the contact holes 19 and 45.

The plugs 21 and 46 are buried by depositing a polycrystalline silicon film (not shown) doped with n-type impurities such as phosphorus (P) in the contact holes 19, 45 and on the silicon oxide film 18, and removing the undesired polycrystalline silicon film outside the contact holes 19, 45 by dry etching. In this case, the polycrsytalline silicon film is over-etched so that the upper surfaces of the plugs 21, 46 are retracted down from the upper ends of the contact holes 19 and 45. The amount of retraction must not be smaller than the thickness of the TiN film (26) deposited on the plugs 21 and 46 in a subsequent step.

Between the contact holes 19 and 45, the contact hole 19 (contact hole to which the bit line BL is connected) has a fine and elongated pattern on a plane partly extending onto the element isolation groove 2 like the contact hole 19 of the embodiment 1 (see FIGS. 11 and 12).

Next, the substrate 1 is heat-treated so that the n-type impurities in the polycrystalline silicon film constituting the plug 21 in the contact hole 19 and the plug 46 in the contact hole 45 are diffused into the substrate 1 (p-type well 3), thereby to form an n+-type semiconductor region 15 (source, drain). Through up to this step, a memory cell-selecting MISFETQs is formed in the memory region.

Referring next to FIG. 38, the silicon oxide film 18 in the logic region and the underlying silicon nitride film 17 are dry-etched using the photoresist (not shown) as a mask to form a contact hole 23 on n+-type semiconductor region 13 (source, drain) of the n-channel MISFETQn and to form a contact hole 24 on the p+-type semiconductor region 14

(source, drain) of the p-channel MISFETQp. At the same time, further, a contact hole 25 is formed on the gate electrode 7C of the p-channel MISFETQp.

Referring next to FIG. 39, plugs 22 constituted by a laminate of the TiN film 26 and the W film 27 are buried in the contact holes 23, 24 and 25 in the logic region and in the contact holes 19 and 45 (on the plugs 21 and 46) in the memory region.

Figure 40:
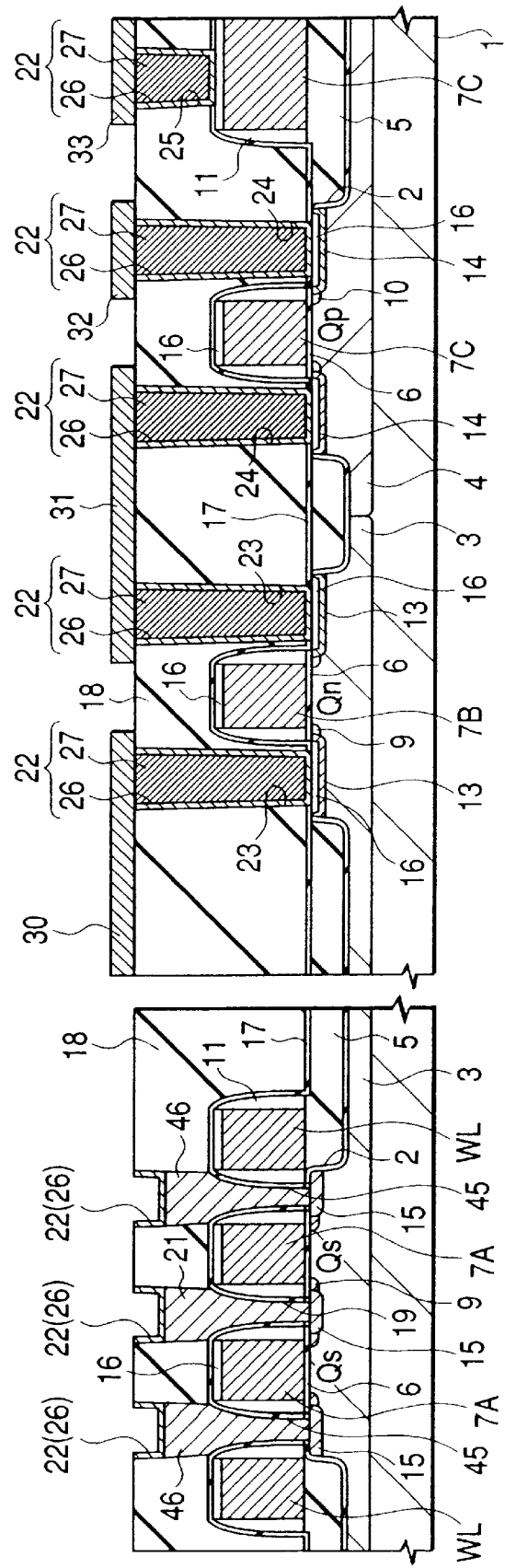
FIG. 40 is a sectional view of a major portion of the substrate illustrating still another stage in the method of manufacturing the semiconductor integrated circuit device according to the embodiment 3 of the invention.
Figure 41:
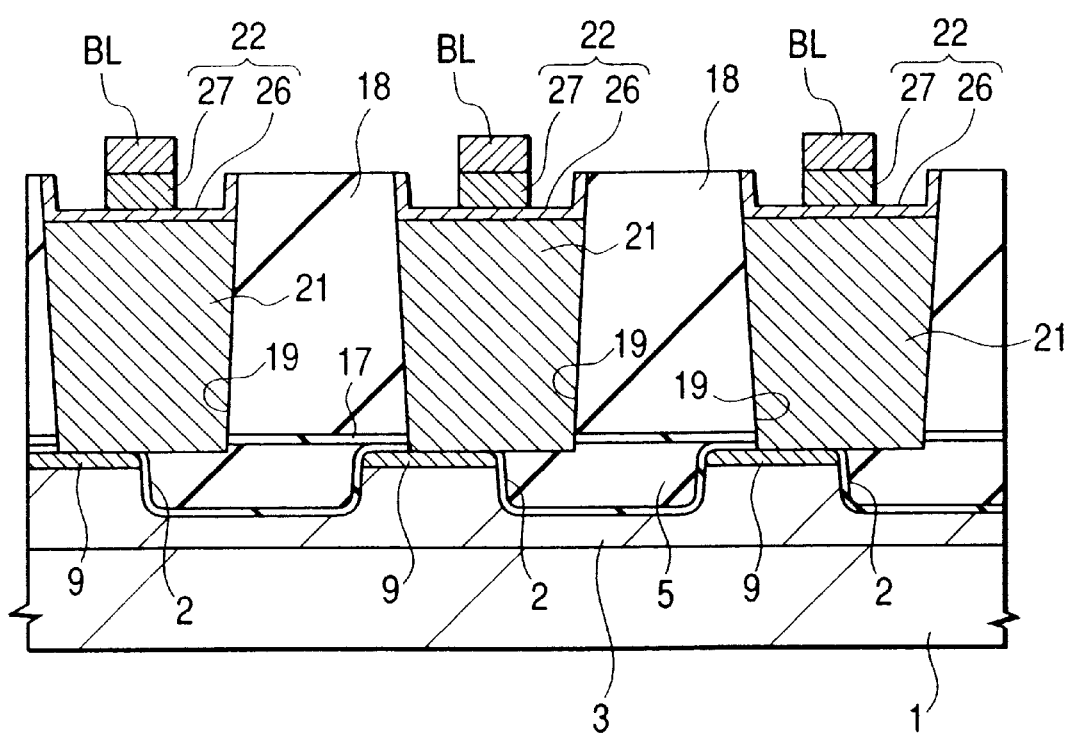
FIG. 41 is a sectional view of a part of a major portion of the substrate illustrating a stage in the method of manufacturing the semiconductor integrated circuit device according to the embodiment 3 of the invention.

Referring next to FIGS. 40 and 41 (sectional views of the memory region along the lengthwise direction of the contact hole 19), a bit line BL is formed on the silicon oxide film 18 in the memory region by the same method as the embodiment 1, and wirings 30, 31, 32 and 33 of the first layer are formed on the silicon oxide film 28 in the logic region.

When the bit line BL is formed, the W film 27 constituting a portion of the plug 22 in the contact hole 19 is etched as shown in FIG. 41. However, the TiN film 26 constituting another portion of the plug 22 is little etched by the gas used for etching the W film, and is not almost removed. Accordingly, the polycrystalline silicon film and the TiN film 26 formed thereon (constituting a portion of the plug 22), that are constituting the plug 21, are contacted to each other over a wide area same as before the bit line BL is formed even after it is formed.

Figure 42:
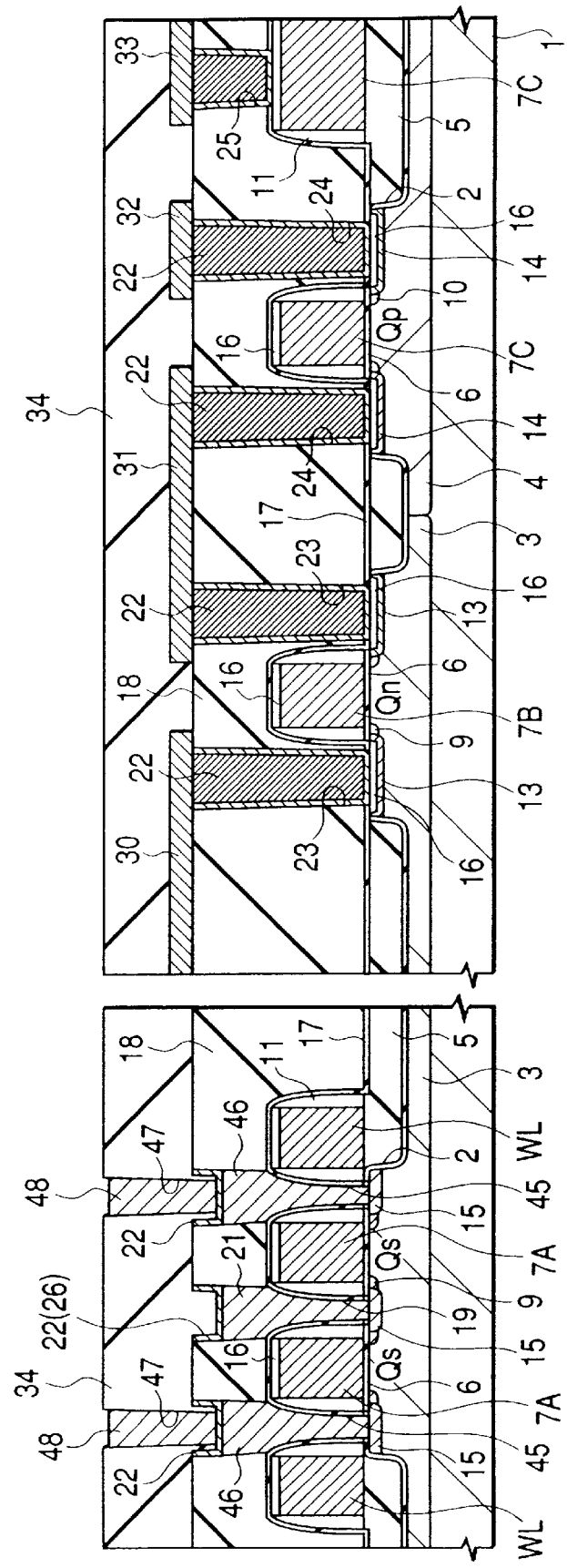
FIG. 42 is a sectional view of a major portion of the substrate illustrating a further stage in the method of manufacturing the semiconductor integrated circuit device according to the embodiment 3 of the invention.

Referring next to FIG. 42, a silicon oxide film 34 is formed on the wirings 30 to 33 of the first layer and on the bit line BL that is not shown. Then, a contact hole 47 is formed in the silicon oxide film 34 on the contact hole 45 in the memory region, and a plug 48 is buried in the contact hole 47. The plug 48 is buried by depositing a polycrystalline silicon film (not shown) of a low resistance doped with n-type impurities such as phosphorus (P) in the contact hole 47 and on the silicon oxide film 34, and removing the unnecessary polycrystalline silicon film on the outer side of the contact hole 47 by dry etching.

Referring next to FIG. 43, a silicon nitride film 40 and a silicon oxide film 41 are successively deposited on the silicon oxide film 34 and, then, a groove 42 is formed in the silicon oxide film 41 and in the silicon nitride film 40 in the memory region.

Then, a lower electrode constituted by a polycrystalline silicon film 43 and a capacitor insulating film constituted by a tantalum oxide film 44 are formed in the groove 42 according to the same method as the embodiment 1, and an upper electrode constituted by a TiN film 45 is formed thereon to nearly complete a memory cell of DRAM constituted by the memory cell-selecting MISFETQs and the data-storing capacitor element C connected in series therewith. The subsequent steps are the same as those of the above embodiment 1.

According to the manufacturing method of this embodiment, the contact area is maintained sufficiently great between the TiN film 26 in the contact hole 19 and the plug 21 (polycrystalline silicon film) preventing an increase in the contact resistance among the bit line BL, plug 22 and plug 21 like in the embodiment 1. Further, a reliable connection is maintained among the bit line BL, plug 22 and plug 21.

Like the above embodiment 1, the manufacturing method of this embodiment makes it possible to decrease the number of the steps for forming bit lines compared with that of the conventional processes.

Figure 45:
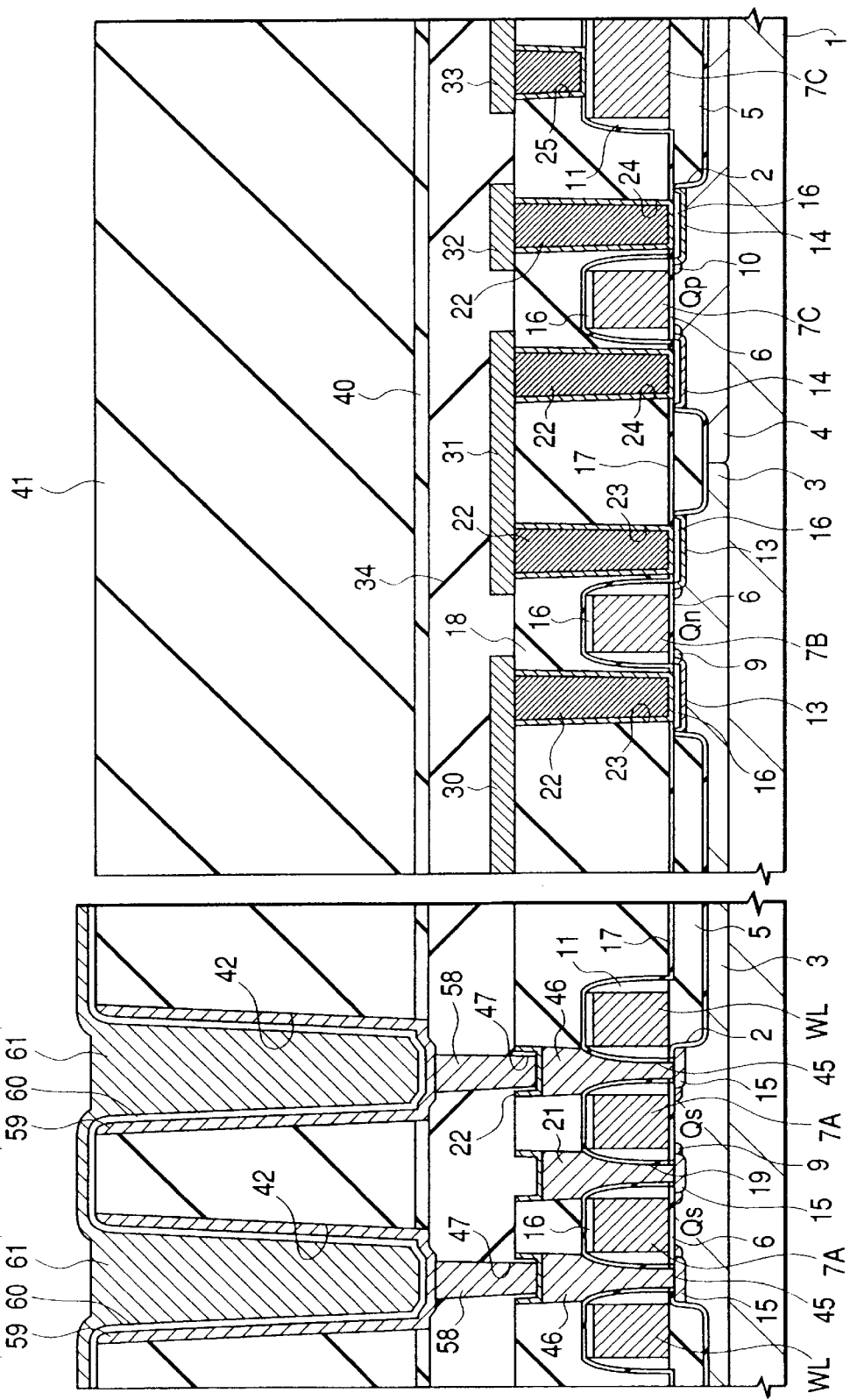
FIG. 45 is a sectional view of a major portion of the substrate illustrating still another stage in the method of manufacturing the semiconductor integrated circuit device according to a modified example of the embodiment 3 of the invention.

As a modified example of the third embodiment as shown in FIG. 45, the lower electrode 59, upper electrode 61 and plug 58 of the data-storing capacitor element C can be formed of an electric conductor containing a metal as a chief component. Upon using a metal film having a resistance smaller than that of the polycrystalline silicon film, it is allowed to lower the resistance of the memory cell as a whole.

Further, when an oxide dielectric film such as tantalum oxide, PZT, PLT, PLZT, PbTiO3, SrTiO3, BaTiO3, BST or SBT is used as a capacitor insulating film 60 and, particularly, when a dielectric film that requires a high-temperature treatment in an oxygen atmosphere in the step of forming the dielectric film is employed as the capacitor insulating film 60, the lower electrode 59 of the capacitor element C is made of a metal material of a Group of platinum, such as platinum or ruthenium, an alloy of the Group of platinum, or a metal material having a large resistance against the oxidation, in order to prevent an increase in the resistance of the lower electrode 59 caused by oxidation.

By using a metal of the Group of platinum, such as platinum or ruthenium or by using a metal having a large resistance against oxidation, such as an alloy of the Group of platinum, as the plug 58, furthermore, it is allowed to prevent the plug 58 from being oxidized with oxygen that diffuses through the lower electrode 59.

When a metal film having a high resistance against oxidation is used for both the lower electrode and the plug, a barrier film such as TiN film 26 formed on the plug 22 makes it possible to prevent the plug 46 formed of polycrystalline silicon from being oxidized.

The material of the barrier film is not limited to TiN only but may be a metal nitride or an alloy of a metal nitride, such as TaN, WN, TiAlN, etc.

In the foregoing were concretely described the embodiments of the invention accomplished by the present inventors. However, the invention is in no way limited to the above embodiments only but can be varied in a variety of ways without departing from the gist and scope of the invention.

In the above-mentioned embodiments 1 to 3, in order to decrease the contact resistance between the polycrystalline silicon plug and the barrier layer, for example, a layer of a metal silicide such as titanium silicide may be formed between the polycrystalline silicon plug and the barrier layer. Even in the case where the metal silicide layer is formed between the polycrystalline silicon plug and the barrier layer, according to this invention, the decrease of the contact area between the barrier layer and the metal silicide layer can be prevented, thereby decreasing the contact resistance and improving the reliability.

The above-mentioned embodiments 1 to 3 have dealt with the case where the width of the bit line BL was selected to be smaller than the diameter of the contact hole 19. Even when the width of the bit line BL is selected to be equal to, or larger than, the diameter of the contact hole 19, however, the invention is effective in preventing the etching of the plug 21 (polycrystalline silicon film) caused by a deviation between the bit line BL and the contact hole 19.

Further, the above embodiments 1 to 3 have dealt with the case where the invention was applied to an LSI mounting a DRAM and a logic circuit. The invention, however, can be applied to the DRAM. In this case, the MISFETs in the logic region explained in the embodiments 1 to 3 may be replaced by the MISFETs in the peripheral circuits of the DRAM.

Briefly described below are the effects obtained by a representative example of the invention disclosed in this application.

(1) The invention deals with a DRAM forming bit lines on the plugs constituted by a polycrystalline silicon film via a barrier layer, preventing a decrease in the contact resistance and improving reliability in the connection by preventing a reduction in the contact area between the plug and the barrier layer. It is therefore allowed to improve reliability in the DRAM and in the LSI mounting the DRAM and logic LSI, as well as to improve the yield of production.

(2) According to the invention, it is allowed to decrease the number of steps for manufacturing the DRAM forming bit lines on the plugs constituted by the polycrystalline silicon film via the barrier layer, or for manufacturing a hybrid LSI mounting the DRAM.

What is claimed is:

1. A method of manufacturing a semiconductor integrated circuit device comprising the steps of:
    (a) forming a first MISFET in a first region on the main surface of a semiconductor substrate, forming a second MISFET in a second region, and forming a first insulating film over the first MISFET and over the second MISFET over the main surface of the semiconductor substrate;
    (b) forming a first connection hole in the first insulating film in the first region, and burying a first plug in the first connection hole, including
    (b-1) forming a first electrically conducting film for constituting the first plug on the first insulating film and in the first connection hole, wherein said first plug is electrically connected to either one of a source and drain of the first MISFET, and
    (b-2) removing the first electrically conducting film on the first insulating film by etching the first electrically conducting film so that the upper surface of the first electrically conducting film in the first connection hole is retracted down from the upper edge of the first connection hole;
    (c) forming a second connection hole in the first insulating film in the second region, burying a second plug on the first plug in the first connection hole in a manner that the first plug and the second plug are electrically connected together, and burying a third plug in the second connection hole so as to be electrically connected to either a source or drain of the second MISFET; and
    (d) forming a first wiring on the first insulating film in the first region, and electrically connecting either the source or the drain of the first MISFET to the first wiring through the first plug and the second plug in the first connection hole.

2. A method of manufacturing a semiconductor integrated circuit device according to claim 1, wherein the first electrically conducting film is constituted chiefly by silicon.

3. A method of manufacturing a semiconductor integrated circuit device according to claim 1, wherein the step of burying the second plug in the first connection hole and burying the third plug in the second connection hole includes the steps of:
    (c-1) forming a metal film of a first metal material to constitute portions of the second plug and of the third plug on the first insulating film, in the first connection hole and in the second connection hole;
    (c-2) forming a metal film of a second metal material on the metal film of the first metal material to constitute other portions of the second plug and of the third plug; and
    (c-3) removing the metal film of the second metal material and the metal film of the first metal material on the first insulating film, but leaving the metal film of the first metal material and the metal film of the second metal material in the first connection hole and in the second connection hole.

4. A method of manufacturing a semiconductor integrated circuit device according to claim 3, wherein the step of forming the first wiring on the first insulating film includes the steps of:
    (d-1) forming a metal film of the second metal material for constituting the first wiring over the first connection hole and on the first insulating film; and
    (d-2) etching the metal film of the second metal material under a condition in which the second metal material is etched at a rate larger than the rate of etching of the first metal material.

5. A method of manufacturing a semiconductor integrated circuit device according to claim 4, wherein a contact resistance effected between the electrically conducting material constituting the first plug and the first metal material is larger than a contact resistance effected between the first metal material and the second metal material.

6. A method of manufacturing a semiconductor integrated circuit device according to claim 2, wherein the step of burying the second plug in the first connection hole and burying the third plug in the second connection hole includes the steps of:
    (c-1) forming a barrier film to constitute portions of the second plug and of the third plug on the first insulating film, on the upper surface of the first electrically conducting film in the first connection hole and in the second connection hole;
    (c-2) forming a metal film on the barrier film; and
    (c-3) removing a portion of the barrier film and a portion of the first metal film to form the second plug in the first connection hole and to form the third plug in the second connection hole.

7. A method of manufacturing a semiconductor integrated circuit device according to claim 6, wherein the barrier film is formed of a nitride of a metal or an alloy.

8. A method of manufacturing a semiconductor integrated circuit device according to claim 6, wherein the first metal film has a thickness larger than a thickness of the barrier film.

9. A method of manufacturing a semiconductor integrated circuit device according to claim 6, wherein the step of forming the first wiring on the first insulating film includes the steps of:
    (d-1) forming a second metal film on the second plug, on the third plug and on the first insulating film; and
    (d-2) forming the first wiring by etching the second metal film under a condition in which the second metal film is etched at a rate larger than the rate of etching the barrier film.

10. A method of manufacturing a semiconductor integrated circuit device according to claim 1, wherein the step of forming the second MISFET includes a step of forming a silicide layer on the surfaces of the source and drain of the second MISFET.

* * * * *